United States Patent
Blackley et al.

(10) Patent No.: US 11,410,384 B2
(45) Date of Patent: Aug. 9, 2022

(54) THREE-DIMENSIONAL DISPLAYS USING ELECTROMAGNETIC FIELD COMPUTATIONS

(71) Applicant: Pacific Light & Hologram, Inc., South Pasadena, CA (US)

(72) Inventors: Jonathan Seamus Blackley, South Pasadena, CA (US); Tina Qin, Van Nuys, CA (US); Asher Zelig Sefami, Los Angeles, CA (US); Kamran Qaderi, Pasadena, CA (US); Mark Anthony Sararu, Los Angeles, CA (US); Joshua D. Wiensch, Pasadena, CA (US); Rajay Kumar, Huntington Beach, CA (US); Sylvain Marcel Colin, Santa Barbara, CA (US)

(73) Assignee: Pacific Light & Hologram, Inc., South Pasadena, CA (US)

( * ) Notice: Subject to any disclaimer, the term of this patent is extended or adjusted under 35 U.S.C. 154(b) by 0 days.

(21) Appl. No.: 17/209,998

(22) Filed: Mar. 23, 2021

(65) Prior Publication Data

US 2021/0209846 A1     Jul. 8, 2021

Related U.S. Application Data

(63) Continuation of application No. 15/930,355, filed on May 12, 2020, now Pat. No. 10,964,103, which is a
(Continued)

(51) Int. Cl.
*G06T 17/10* (2006.01)
*G06T 15/20* (2011.01)
(Continued)

(52) U.S. Cl.
CPC .......... *G06T 17/10* (2013.01); *G01R 29/0807* (2013.01); *G02B 5/32* (2013.01);
(Continued)

(58) Field of Classification Search
None
See application file for complete search history.

(56) References Cited

U.S. PATENT DOCUMENTS

| 4,586,780 A | 5/1986 | Chern et al. |
| 5,016,950 A | 5/1991 | Smith |
(Continued)

FOREIGN PATENT DOCUMENTS

| CN | 101241603 | 8/2008 |
| CN | 104776865 | 7/2015 |
(Continued)

OTHER PUBLICATIONS

International Search Report and Written Opinion for corresponding PCT Appl No. PCT/US19/13857, dated Jun. 26, 2019.
(Continued)

*Primary Examiner* — Tize Ma
(74) *Attorney, Agent, or Firm* — Fish & Richardson P.C.

(57) ABSTRACT

Methods, apparatus, devices, and systems for three-dimensional (3D) displaying objects are provided. In one aspect, a method includes obtaining data including respective primitive data for primitives corresponding to an object, determining an electromagnetic (EM) field contribution to each element of a display for each of the primitives by calculating an EM field propagation from the primitive to the element, generating a sum of the EM field contributions from the primitives for each of the elements, transmitting to each of the elements a respective control signal for modulating at least one property of the element based on the sum of the EM field contributions, and transmitting a timing control signal
(Continued)

to an illuminator to activate the illuminator to illuminate light on the display, such that the light is caused by the modulated elements of the display to form a volumetric light field corresponding to the object.

44 Claims, 16 Drawing Sheets

Related U.S. Application Data continuation of application No. PCT/US2019/013857, filed on Jan. 16, 2019.

(60) Provisional application No. 62/618,054, filed on Jan. 16, 2018.

(51) Int. Cl.
| | |
|---|---|
| G06T 15/00 | (2011.01) |
| G02B 30/52 | (2020.01) |
| G02B 30/56 | (2020.01) |
| G06T 15/30 | (2011.01) |
| G03H 1/02 | (2006.01) |
| G09G 3/00 | (2006.01) |
| H04N 13/15 | (2018.01) |
| H04N 13/275 | (2018.01) |
| G01R 29/08 | (2006.01) |
| H04N 13/296 | (2018.01) |
| G02B 30/40 | (2020.01) |
| G02B 5/32 | (2006.01) |
| G06T 19/00 | (2011.01) |
| H04N 13/349 | (2018.01) |
| G02B 27/01 | (2006.01) |
| H04N 13/32 | (2018.01) |
| H04N 13/324 | (2018.01) |

(52) U.S. Cl.
CPC ......... *G02B 27/0103* (2013.01); *G02B 30/40* (2020.01); *G02B 30/52* (2020.01); *G02B 30/56* (2020.01); *G03H 1/0248* (2013.01); *G06T 15/005* (2013.01); *G06T 15/205* (2013.01); *G06T 15/30* (2013.01); *G06T 19/006* (2013.01); *G09G 3/003* (2013.01); *H04N 13/15* (2018.05); *H04N 13/275* (2018.05); *H04N 13/296* (2018.05); *H04N 13/32* (2018.05); *H04N 13/324* (2018.05); *H04N 13/349* (2018.05); *G02B 2027/0109* (2013.01); *G03H 2001/0212* (2013.01); *G03H 2001/0224* (2013.01); *G06T 2210/21* (2013.01)

(56) References Cited

U.S. PATENT DOCUMENTS

| | | | |
|---|---|---|---|
| 5,144,288 | A | 9/1992 | Hamada |
| 5,347,375 | A | 9/1994 | Saito |
| 5,668,648 | A | 9/1997 | Saito |
| 5,719,600 | A | 2/1998 | Alcorn |
| 5,753,349 | A | 5/1998 | Boswell |
| 5,825,448 | A | 10/1998 | Bos et al. |
| 6,256,120 | B1 | 7/2001 | Suzuki |
| 6,288,803 | B1 | 9/2001 | Hattori et al. |
| 6,580,388 | B1 | 6/2003 | Stoyanov |
| 6,606,095 | B1 | 8/2003 | Lengyel |
| 7,103,099 | B1 | 9/2006 | Paz |
| 7,277,209 | B1 | 10/2007 | Grossetie |
| 7,660,039 | B2 | 2/2010 | Santoro et al. |
| 7,837,361 | B2 | 11/2010 | Santoro et al. |
| 8,047,673 | B2 | 11/2011 | Santoro |
| 8,218,211 | B2 | 7/2012 | Kroll |
| 8,233,204 | B1 | 7/2012 | Robbins et al. |
| 8,400,696 | B2 | 3/2013 | Ikeda |
| 8,786,925 | B2 | 7/2014 | Hart et al. |
| 8,976,081 | B2 | 3/2015 | Rao |
| 9,515,099 | B2 | 12/2016 | Kwon |
| 9,990,877 | B2 | 6/2018 | Kim |
| 10,098,565 | B2 | 10/2018 | Brannan |
| 10,156,725 | B2 | 12/2018 | TeKolste et al. |
| 10,379,496 | B2 | 8/2019 | Onural |
| 10,445,556 | B2 | 10/2019 | Vilenskii et al. |
| 10,475,370 | B2 | 11/2019 | Spitzer |
| 10,534,209 | B1 | 1/2020 | Fu |
| 10,853,999 | B2 | 12/2020 | Blackley |
| 10,854,000 | B2 | 12/2020 | Blackley |
| 10,867,439 | B2 | 12/2020 | Blackley |
| 10,878,622 | B2 | 12/2020 | Blackley |
| 10,878,623 | B2 | 12/2020 | Blackley |
| 10,902,673 | B2 | 1/2021 | Blackley |
| 10,909,756 | B2 | 2/2021 | Blackley |
| 10,964,103 | B2 | 3/2021 | Blackley |
| 2001/0024177 | A1 | 9/2001 | Popovich |
| 2003/0081154 | A1 | 5/2003 | Coleman et al. |
| 2003/0151809 | A1 | 8/2003 | Takahashi |
| 2004/0004586 | A1 | 1/2004 | Endo et al. |
| 2004/0066547 | A1 | 4/2004 | Parker et al. |
| 2004/0094699 | A1 | 5/2004 | Goto et al. |
| 2004/0105091 | A1 | 6/2004 | Zaidi et al. |
| 2005/0078374 | A1 | 4/2005 | Taira et al. |
| 2005/0122454 | A1 | 6/2005 | Sharp |
| 2006/0139711 | A1 | 6/2006 | Leister et al. |
| 2006/0239171 | A1 | 10/2006 | Ooi et al. |
| 2006/0279528 | A1 | 12/2006 | Schobben |
| 2007/0024999 | A1 | 2/2007 | Crossland |
| 2007/0242325 | A1 | 10/2007 | Kitamura |
| 2007/0257943 | A1 | 11/2007 | Miller |
| 2008/0037131 | A1 | 2/2008 | Steenblik et al. |
| 2008/0247128 | A1 | 10/2008 | Khoo |
| 2008/0300478 | A1 | 12/2008 | Zuhars |
| 2009/0015922 | A1 | 1/2009 | St. Hilaire |
| 2009/0128562 | A1 | 5/2009 | McCombe |
| 2009/0303597 | A1 | 12/2009 | Miyawaki et al. |
| 2010/0085642 | A1 | 4/2010 | Drinkwater |
| 2010/0149139 | A1 | 6/2010 | Kroll |
| 2010/0157399 | A1 | 6/2010 | Kroll |
| 2010/0238528 | A1 | 9/2010 | Govil et al. |
| 2010/0328433 | A1 | 12/2010 | Li |
| 2010/0328759 | A1 | 12/2010 | Kirkby et al. |
| 2011/0050655 | A1 | 3/2011 | Mukawa |
| 2011/0157667 | A1 | 6/2011 | Lacoste |
| 2012/0008181 | A1 | 1/2012 | Cable |
| 2012/0218481 | A1 | 8/2012 | Popovich |
| 2012/0236415 | A1 | 9/2012 | Nagano et al. |
| 2013/0022222 | A1 | 1/2013 | Zschau |
| 2013/0100513 | A1* | 4/2013 | Choi ................... G03H 1/2286 359/23 |
| 2013/0135290 | A1 | 5/2013 | Davidson |
| 2013/0208508 | A1 | 8/2013 | Nichol et al. |
| 2013/0268357 | A1 | 10/2013 | Heath |
| 2013/0278631 | A1 | 10/2013 | Border |
| 2013/0306627 | A1 | 11/2013 | Libman |
| 2014/0064655 | A1 | 3/2014 | Nguyen et al. |
| 2014/0071539 | A1 | 3/2014 | Gao |
| 2014/0222884 | A1* | 8/2014 | Gupta ................... G06F 7/535 708/650 |
| 2014/0354697 | A1 | 12/2014 | Endisch |
| 2014/0358002 | A1 | 12/2014 | Daoura |
| 2015/0277378 | A1 | 10/2015 | Smithwick |
| 2015/0325035 | A1 | 11/2015 | Howell |
| 2015/0355597 | A1 | 12/2015 | Schwerdtner |
| 2015/0378080 | A1 | 12/2015 | Georgiou |
| 2016/0055778 | A1 | 2/2016 | Kim |
| 2016/0077367 | A1 | 3/2016 | Jasper |
| 2016/0078683 | A1 | 3/2016 | Sudol |
| 2016/0104750 | A1 | 4/2016 | Jinta et al. |
| 2016/0147000 | A1 | 5/2016 | Yoon |
| 2016/0147003 | A1 | 5/2016 | Morozov |
| 2016/0157828 | A1 | 6/2016 | Sumi |
| 2016/0223987 | A1 | 8/2016 | Park |
| 2016/0291545 | A1 | 10/2016 | Fan |
| 2016/0336484 | A1 | 11/2016 | McGroddy |

(56) References Cited

U.S. PATENT DOCUMENTS

| | | |
|---|---|---|
| 2016/0349508 A1 | 12/2016 | Horikawa |
| 2016/0379606 A1 | 12/2016 | Kollin et al. |
| 2017/0038727 A1 | 2/2017 | Kim |
| 2017/0160547 A1 | 6/2017 | Webster et al. |
| 2017/0269767 A1 | 9/2017 | Yang |
| 2017/0293259 A1 | 10/2017 | Ochiai |
| 2017/0308988 A1 | 10/2017 | Li |
| 2017/0322414 A1 | 11/2017 | Ishii |
| 2017/0323125 A1 | 11/2017 | Yang |
| 2017/0351944 A1 | 12/2017 | Yang |
| 2018/0024289 A1 | 1/2018 | Fattal |
| 2018/0039072 A1 | 2/2018 | Okumura |
| 2018/0231789 A1 | 8/2018 | Ng |
| 2018/0253869 A1 | 9/2018 | Yumer |
| 2018/0275350 A1 | 9/2018 | Oh |
| 2018/0284460 A1 | 10/2018 | Cheng et al. |
| 2018/0364641 A1 | 12/2018 | Park |
| 2019/0004478 A1 | 1/2019 | Gelman et al. |
| 2019/0014319 A1 | 1/2019 | Jannard |
| 2019/0101866 A1 | 4/2019 | Georgiou |
| 2019/0113802 A1 | 4/2019 | Won et al. |
| 2019/0121291 A1 | 4/2019 | Leister |
| 2019/0155033 A1 | 5/2019 | Gelman et al. |
| 2019/0196400 A1 | 6/2019 | Chang |
| 2020/0278498 A1 | 9/2020 | Schultz et al. |
| 2020/0278543 A1 | 9/2020 | Shultz et al. |
| 2020/0341194 A1 | 10/2020 | Waldern et al. |
| 2021/0294003 A1 | 9/2021 | Roehrig et al. |
| 2021/0397128 A1 | 12/2021 | Hirose et al. |
| 2022/0050298 A1 | 2/2022 | Klug et al. |
| 2022/0082886 A1 | 3/2022 | Qaderi et al. |
| 2022/0082998 A1 | 3/2022 | Qaderi et al. |
| 2022/0083000 A1 | 3/2022 | Qaderi et al. |
| 2022/0083001 A1 | 3/2022 | Qaderi et al. |
| 2022/0083002 A1 | 3/2022 | Qaderi et al. |
| 2022/0083003 A1 | 3/2022 | Qaderi et al. |
| 2022/0083006 A1 | 3/2022 | Qaderi et al. |
| 2022/0086419 A1 | 3/2022 | Qaderi et al. |

FOREIGN PATENT DOCUMENTS

| | | |
|---|---|---|
| CN | 109564403 | 4/2019 |
| JP | 2016-042036 | 3/2016 |
| WO | WO 2017/120320 | 7/2017 |
| WO | WO 2017/198713 | 11/2017 |
| WO | WO 2019/143729 | 7/2019 |
| WO | WO 2022/060734 | 3/2022 |

OTHER PUBLICATIONS

International Preliminary Report on Patentability for corresponding PCT Appl No. PCT/US19/13857, dated Dec. 13, 2019.

Chapter II Amendment for corresponding PCT Appl No. PCT/US19/13857, dated Aug. 15, 2019.

Extended European Search Report in European Appln No. 19741590.4, dated Oct. 27, 2021, 7 pages.

Ichikawa et al., "Realistic expression for full-parallax computer-generated holograms with the ray-tracing method," Optical Society of America, Nov. 16, 2012, 9 pages.

Ichikawa et al., "Proceedings of Spie; Realistic 3D image reconstruction in CGH with Fourier transform optical system," Proc. SPIE 8644, Practical Holography XXVII: Materials and Applications, Mar. 1, 2013, doi: 10.1117112.2003371.

U.S. Appl. No. 16/872,307, filed May 11, 2020, Jonathan Seamus Blackley.

U.S. Appl. No. 16/872,317, filed May 11, 2020, Jonathan Seamus Blackley.

U.S. Appl. No. 15/930,325, filed May 12, 2020, Jonathan Seamus Blackley.

U.S. Appl. No. 15/930,355, filed May 12, 2020, Jonathan Seamus Blackley.

U.S. Appl. No. 15/931,139, filed May 13, 2020, Jonathan Seamus Blackley.

U.S. Appl. No. 15/930,886, filed May 13, 2020, Jonathan Seamus Blackley.

U.S. Appl. No. 15/930,663, filed May 13, 2020, Jonathan Seamus Blackley.

U.S. Appl. No. 15/930,661, filed May 13, 2020, Jonathan Seamus Blackley.

* cited by examiner

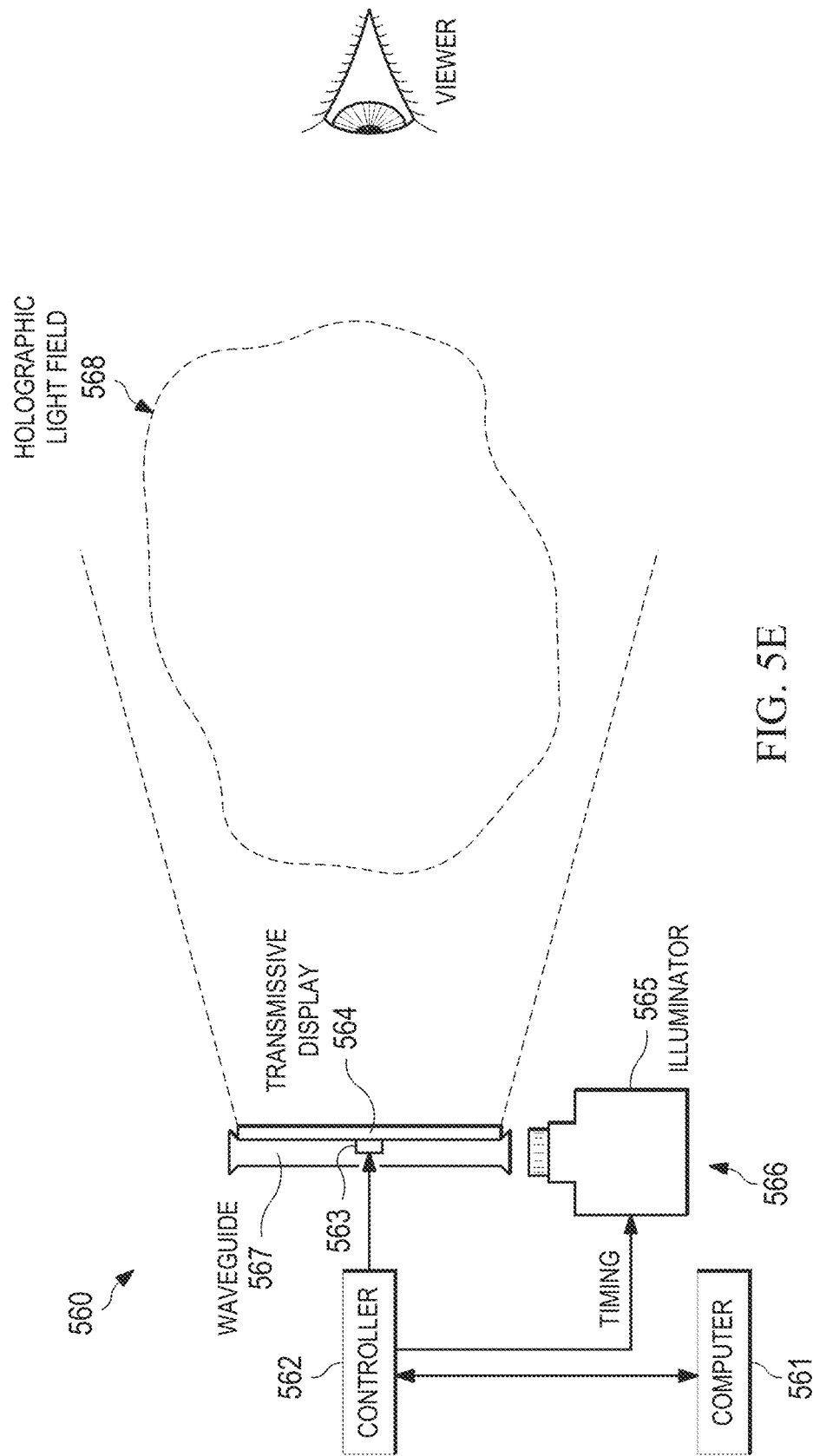

THREE-DIMENSIONAL DISPLAYS USING ELECTROMAGNETIC FIELD COMPUTATIONS

INCORPORATION BY REFERENCE

The present application is a continuation of, and claims benefit under 35 USC § 120 to, U.S. application Ser. No. 15/930,355, filed May 12, 2020, which is a continuation of, and claims benefit under 35 USC § 120 to, international application PCT/US2019/013857, filed Jan. 16, 2019, and entitled "Three-Dimensional Displays Using Electromagnetic Field Computations," which claims benefit under 35 U.S.C. § 119 to U.S. Ser. No. 62/618,054, filed Jan. 16, 2018, and entitled "Three-Dimensional Displays Using Electromagnetic Field Computations." The entire contents of these applications are incorporated by reference herein.

TECHNICAL FIELD

This disclosure relates to three-dimensional (3D) displays, and more particularly to 3D displays using computation technology.

BACKGROUND

Advances in traditional two-dimensional (2D) projection and 3D rendering have led to new approaches for 3D displays, including numerous hybrid techniques that mix head and eye tracking with conventional display devices for virtual reality (VR), augmented reality (AR), and mixed reality (MR). These techniques attempt to replicate an experience of holographic imagery, combined with tracking and measurement-based calculations, to simulate stereo or in-eye light field that can be represented by an actual hologram.

SUMMARY

The present disclosure describes methods, apparatus, devices, and systems for using electromagnetic (EM) field computations for three-dimensional (3D) displays.

The present disclosure provides technology that can overcome limitations present in known technologies. As an example, the technology disclosed herein can be implemented without the use of cumbersome wearable devices, such as "3D glasses." As another example, the technology disclosed herein can optionally be implemented without being limited by accuracy tracking mechanisms, the quality of the display devices, relatively long processing times and/or relatively high computational demands, and/or by an inability to display objects to multiple viewers simultaneously. As a further example, the technology can be implemented without specialized tools and software to develop contents that extend above and beyond the tools and software used in conventional 3D content creation. Various embodiments may exhibit one or more of the foregoing advantages. For example, certain implementations of the present disclosure can produce real-time, full color, genuine 3D images that appear to be real 3D objects in the world and can be viewed without encumbrances by multiple viewers simultaneously from different points.

One aspect of the present disclosure features a method including: for each of a plurality of primitives corresponding to an object in a three-dimensional (3D) space, determining an electromagnetic (EM) field contribution to each of a plurality of elements of a display by computing, in a 3D coordinate system, EM field propagation from the primitive to the element; and for each of the plurality of elements, generating a sum of the EM field contributions from the plurality of primitives to the element.

The EM field contribution can include at least one of a phase contribution or an amplitude contribution. The primitives can include at least one of a point primitive, a line primitive, or a polygon primitive. The primitives can include a line primitive including at least one of a gradient color, a textured color, or any surface shading effect. The primitives can also include a polygon primitive including at least one of a gradient color, a textured color, or any surface shading effect. The plurality of primitives can be indexed in a particular order.

In some implementations, the method further includes obtaining respective primitive data for each of the plurality of primitives. The respective primitive data of each of the plurality of primitives can include respective color information of the primitive, and the determined EM field contributions for each of the elements include information corresponding to the respective color information of the primitives. The color information can include at least one of a textured color or a gradient color. The respective primitive data of each of the plurality of primitives can include texture information of the primitive. The respective primitive data of each of the plurality of primitives can include shading information on one or more surfaces of the primitive. The shading information can include a modulation on at least one of color or brightness on the one or more surfaces of the primitive.

In some implementations, the respective primitive data of each of the plurality of primitives includes respective coordinate information of the primitive in the 3D coordinate system. Respective coordinate information of each of the plurality of elements in the 3D coordinate system can be determined based on the respective coordinate information of the plurality of primitives in the 3D coordinate system. The respective coordinate information of each of the elements can correspond to a logical memory address for the element stored in a memory.

Determining the EM field contribution to each of the plurality of elements for each of the plurality of primitives can include determining, in the 3D coordinate system, at least one distance between the element and the primitive based on the respective coordinate information of the element and the respective coordinate information of the primitive. In some examples, determining the EM field contribution to each of the plurality of elements for each of the plurality of primitives includes: determining a first distance between a first primitive of the plurality of primitives and a first element of the plurality of elements based on the respective coordinate information of the first primitive and the respective coordinate information of the first element; and determining a second distance between the first primitive and a second element of the plurality of elements based on the first distance and a distance between the first element and the second element. The distance between the first element and the second element can be predetermined based on a pitch of the plurality of elements of the display.

In some examples, at least one of the plurality of primitives is a line primitive including first and second endpoints, and determining at least one distance between the element and the primitive includes: determining a first distance between the element and the first endpoint of the line primitive; and determining a second distance between the element and the second point of the line primitive. In some examples, at least one of the plurality of primitives is a triangle primitive including first, second, and third endpoints, and determining at least one distance between the element and the primitive includes: determining a first distance between the element and the first endpoint of the triangle primitive; determining a second distance between the element and the second point of the triangle primitive; and determining a third distance between the element and the third point of the triangle primitive.

In some implementations, determining the EM field contribution to each of the plurality of elements for each of the plurality of primitives includes determining the EM field contribution to the element from the primitive based on a predetermined expression for the primitive and the at least one distance. In some cases, the predetermined expression is determined by analytically calculating the EM field propagation from the primitive to the element. In some cases, the predetermined expression is determined by solving Maxwell's equations. The Maxwell's equations can be solved by providing a boundary condition defined at a surface of the display. The boundary condition can include a Dirichlet boundary condition or a Cauchy boundary condition. The plurality of primitives and the plurality of elements can be in the 3D space, and a surface of the display can form a portion of a boundary surface of the 3D space. In some cases, the predetermined expression includes at least one of functions including a sine function, a cosine function, or an exponential function, and determining the EM field contribution includes identifying a value of the at least one of the functions in a table stored in a memory.

In some implementations, determining the EM field contribution to each of the plurality of elements for each of the plurality of primitives and generating the sum of the field contributions for each of the plurality of elements includes: determining first EM field contributions from the plurality of primitives to a first element of the plurality of elements and summing the first EM field contributions for the first element; and determining second EM field contributions from the plurality of primitives to a second element of the plurality of elements and summing the second EM field contributions for the second element. Determining the first EM field contributions from the plurality of primitives to the first element can include: determining an EM field contribution from a first primitive of the plurality of primitives to the first element in parallel with determining an EM field contribution from a second primitive of the plurality of primitives to the first element.

In some implementations, determining the EM field contribution to each of the plurality of elements for each of the plurality of primitives includes: determining first respective EM field contributions from a first primitive of the plurality of primitives to each of the plurality of elements; and determining second respective EM field contributions from a second primitive of the plurality of primitives to each of the plurality of elements, and generating the sum of the field contributions for each of the plurality of elements can include: accumulating the EM field contributions for the element by adding the second respective EM field contribution to the first respective EM field contribution for the element. Determining the first respective EM field contributions from the first primitive to each of the plurality of elements can be performed in parallel with determining the second respective EM field contributions from the second primitive to each of the plurality of elements.

Determining the EM field contribution to each of the plurality of elements for each of the plurality of primitives can include: determining a first EM field contribution from a first primitive of the plurality of primitives to a first element of the plurality of elements in parallel with determining a second EM field contribution from a second primitive of the plurality of primitives to the first element.

In some implementations, the method further includes: for each of the plurality of elements, generating a respective control signal based on the sum of the EM field contributions from the plurality of primitives to the element, the respective control signal being for modulating at least one property of the element based on the sum of the EM field contributions from the plurality of primitives to the element. The at least one property of the element can include at least one of a refractive index, an amplitude index, a birefringence, or a retardance. The respective control signal can include an electrical signal, an optical signal, a magnetic signal, or an acoustic signal. In some cases, the method further includes: multiplying a scale factor to the sum of the field contributions for each of the elements to obtain a scaled sum of the field contributions, and the respective control signal is generated based on the scaled sum of the field contributions for the element. In some cases, the method further includes: normalizing the sum of the field contributions for each of the elements, and the respective control signal is based on the normalized sum of the field contributions for the element. The method can also include: transmitting the respective control signal to the element.

In some implementations, the method further includes: transmitting a control signal to an illuminator, the control signal indicating to turn on the illuminator such that the illuminator emits light on the display. The control signal can be transmitted in response to determining a completion of obtaining the sum of the field contributions for each of the plurality of elements. The modulated elements of the display can cause the light to propagate in different directions to form a volumetric light field corresponding to the object in the 3D space. The volumetric light field can correspond to a solution of Maxwell's equations with a boundary condition defined by the modulated elements of the display. The light can include a white light, and the display can be configured to diffract the white light into light with different colors.

In some implementations, the method further includes representing values using fixed point number representations during calculation. Each of the values can be represented as integers with an implicit scale factor.

In some implementations, the method further includes performing a mathematical function using fixed point number representations. The mathematical function can include at least one of sine, cosine, and arc tangent. Performing the mathematical function can include receiving an expression in a first fixed point format, and outputting a value at a second fixed point format that has a level of accuracy different from that of the first fixed point format. Performing the mathematical function can include looking up a table for calculation of the mathematical function, wherein the table includes at least one of a fully enumerated look-up table, an interpolated table, a semi-table based polynomial functions, and a semi-table based on full minimax polynomials. Performing the mathematical function can include applying a specialized range reduction for an input. Performing the mathematical function can include transforming a trigonometric calculation from a range $[-\pi, \pi]$ into a signed 2's compliment representation in a range $[-1,1]$.

Another aspect of the present disclosure features a method that includes: obtaining respective primitive data of a plurality of primitives corresponding to an object in a three-dimensional (3D) space; calculating first respective electromagnetic (EM) field contributions from a first primitive of the plurality of primitives to each of a plurality of elements of a display; and calculating second respective EM field contributions from a second primitive of the plurality of primitives to each of the plurality of elements of the display. Calculating the first respective EM field contributions from the first primitive is at least partially in parallel with calculating the second respective EM field contributions from the second primitive.

In some implementations, calculating a first EM field contribution from the first primitive to a first element of the plurality of elements is in parallel with calculating a second EM field contribution from a second primitive of the plurality of primitives to the first element. The method can include calculating respective EM field contributions from each of the plurality of primitives to each of the plurality of elements. The calculation of the respective EM field contributions can be without at least one of: expanding geometry of the object into the plurality of elements; applying visibility tests before packing wavefronts; and decision making or communication between parallel calculations for different primitives. The calculation of the respective EM field contributions can be configured to cause at least one of: tuning parallel calculations for different primitives to speed, cost, size or energy optimization; reducing latency between initiating a draw and a result being ready for display; increasing accuracy using fixed point number representations; and optimizing computation speed by optimizing mathematical functions.

In some implementations, the method further includes representing values using fixed point number representations during calculation. Representing the values using the fixed point number representations can without at least one of: denormal floats for gradual underflow; handling NaN results from operations including division by zero; altering floating point rounding modes; and raising floating point exceptions to an operating system.

In some implementations, the method further includes, for each of the plurality of elements, accumulating EM field contributions for the element by adding the second respective EM field contribution for the element to the first respective EM field contribution for the element.

In some implementations, the method further includes, for each of the plurality of elements, generating a respective control signal based on a sum of the EM field contributions from the plurality of primitives to the element, wherein the respective control signal is for modulating at least one property of the element based on the sum of the EM field contributions from the plurality of primitives to the element.

In some implementations, the method further includes scaling a first primitive adjacent to a second primitive by a predetermined factor such that a reconstruction of the first primitive does not overlap with a reconstruction of the second primitive. The predetermined factor can be determined at least partially based on a resolution of the display. The method can further include: obtaining respective primitive data for each of the plurality of primitives, wherein the respective primitive data of each of the plurality of primitives comprises respective coordinate information of the primitive in the 3D coordinate system; and determining new respective coordinate information of the first primitive based on the respective coordinate information of the first primitive and the predetermined factor. The method can further include determining an EM field contribution from the first primitive to each of the plurality of elements based on the new respective coordinate information of the first primitive. The method can further include scaling the second primitive by the predetermined factor. The first primitive and the second primitive can share a common part, wherein scaling the first primitive comprises scaling the common part of the first primitive. Scaling the first primitive can include scaling the first primitive in a predetermined direction.

Another aspect of the present disclosure features a method that includes: obtaining respective primitive data of a plurality of primitives corresponding to an object in a three-dimensional (3D) space; scaling a first primitive adjacent to a second primitive by a predetermined factor using the respective primitive data for the first primitive and the second primitive; and updating the respective primitive data for the first primitive based on a result of the scaling.

In some implementations, the respective primitive data of each of the plurality of primitives include respective coordinate information of the primitive in a 3D coordinate system, and updating the respective primitive data includes determining new respective coordinate information of the first primitive based on the respective coordinate information of the first primitive and the predetermined factor.

In some implementations, the predetermined factor is determined such that a reconstruction of the first primitive does not overlap with a reconstruction of the second primitive in the 3D space.

In some implementations, the scaling is performed such that a gap between reconstruction of the first primitive and the second primitive in the 3D space is big enough to separate the first and second primitives to minimize an overlapping effect and small enough to make the reconstruction appear seamless.

In some implementations, the predetermined factor is determined at least partially based on a resolution of the display.

In some implementations, the method further includes storing the updated primitive data for the first primitive in a buffer.

In some implementations, the scaling is performed during a rendering process of the object for obtaining the respective primitive data of the plurality of primitives.

In some implementations, the method further includes transmitting updated primitive data for the plurality of primitives to a controller, wherein the controller is configured to determining respective electromagnetic (EM) field contributions from each of the plurality of primitives to each of a plurality of elements of a display based on the updated primitive data for the plurality of primitives.

In some implementations, the method further includes determining an EM field contribution from the first primitive to each of a plurality of elements of a display based on the updated primitive data of the first primitive.

In some implementations, the method further includes scaling the second primitive by the predetermined factor.

In some implementations, the first primitive and the second primitive share a common part, and scaling the first primitive comprises scaling the common part of the first primitive.

In some implementations, scaling the first primitive includes scaling the first primitive in a predetermined direction.

In some implementations, scaling the first primitive includes scaling a first part of the first primitive by a first predetermined factor, and scaling a second part of the second primitive by a second predetermined factor, where the first predetermined factor is different from the second predetermined factor.

Another aspect of the present disclosure features a method that includes: obtaining a plurality of discrete cosine transform (DCT) weights of an image to be mapped on a specified surface of a particular primitive of a plurality of primitives corresponding to an object in a three-dimensional (3D) space; and determining a respective EM field contribution from the particular primitive to each of a plurality of elements of a display by taking into consideration of an effect of the plurality of DCT weights of the image.

In some implementations, the method further includes: determining a resolution for the image to be mapped on the specified surface of the particular primitive; and determining the plurality of DCT weights of the image based on the resolution.

In some implementations, the method further includes decoding the DCT weights of the image to obtain a respective DCT amplitude for each pixel of the image.

In some implementations, the method further includes storing values associated with the respective DCT amplitudes of the pixels of the image together with primitive data of the particular primitive. Determining the respective EM field contribution can include calculating the respective EM field contribution from the particular primitive to each of the plurality of elements with the values associated with the respective DCT amplitudes of the pixels of the image.

In some implementations, the method further includes selecting particular DCT terms to be included in the determining of the respective EM field contribution, each of the particular DCT terms having a respective DCT weight higher than a predetermined threshold.

Another aspect of the present disclosure features a method that includes: obtaining information of a given primitive and an occluder of the given primitive, wherein the given primitive is within a plurality of primitives corresponding to an object in a three-dimensional (3D) space; and determining one or more particular elements of a plurality of elements of a display that do not contribute to a reconstruction of the given primitive at an effect of the occluder.

In some implementations, the method further includes storing the information of the particular elements with the information of the given primitive and the occluder.

In some implementations, the determining is performed during a rendering process of the object for obtaining primitive data of the plurality of primitives.

In some implementations, the method further includes transmitting the stored information of the particular elements with the information of the given primitive and the occluder to a controller configured to calculate electromagnetic (EM) contributions for the plurality of primitives to the plurality of elements of the display.

In some implementations, the method further includes, for each one of the particular elements, generating a sum of electromagnetic (EM) field contributions from the plurality of primitives to the one of the particular elements by excluding an EM field contribution from the given primitive to the one of the particular elements.

In some implementations, the method further includes, for each of the plurality of elements other than the particular elements, generating a respective sum of EM field contributions from the plurality of primitives to the element.

In some implementations, the method further includes masking an EM field contribution of the particular elements to the given primitive.

In some implementations, determining the one or more particular elements includes: connecting the given primitive to endpoints of the occluder; extending the connection to the display to determine intersections between the connection and the display; and determining a particular range defined by the intersections to be the particular elements that do not contribute to the reconstruction of the given primitive at the effect of the occluder.

Another aspect of the present invention features a method that includes: obtaining information of a given primitive and an occluder of the given primitive, wherein the given primitive is within a plurality of primitives corresponding to an object in a three-dimensional (3D) space; and for each of a plurality of elements of a display, determining a respective part of the given primitive that does not make an electromagnetic (EM) field contribution to the element at an effect of the occluder.

In some implementations, the method further includes storing the information of the respective part of the given primitive with the information of the given primitive and the occluder.

In some implementations, the determining is performed during a rendering process of the object for obtaining primitive data of the plurality of primitives.

In some implementations, the method further includes transmitting the stored information of the respective part of the given information with the information of the given primitive and the occluder to a controller configured to calculate electromagnetic (EM) contributions for the plurality of primitives to the plurality of elements of the display.

In some implementations, the method further includes masking an EM field contribution of each of the plurality of elements to the respective part of the given primitive.

In some implementations, the method further includes, for each of the plurality of elements, generating a sum of EM field contributions from the plurality of primitives to the element by excluding an EM field contribution from the respective part of the given primitive to the element. Generating the sum of EM field contributions from the plurality of primitives to the element can include subtracting the EM contribution of the respective part of the given primitive to the element from the sum of EM field contributions from the plurality of primitive to the element without the effect of the occluder. Generating the sum of EM field contributions from the plurality of primitives to the element can include summing EM field contributions from one or more other parts of the given primitive to the element, the respective part and the one or more other parts forming the given primitive.

In some implementations, determining a respective part of the given primitive that do not make an EM field contribution to the element at an effect of the occluder includes: connecting the element to endpoints of the occluder; determining intersections between the connection and the given primitive; and determining a particular part of the given primitive that is enclosed by the intersections to be the respective part of the given primitive that does not make the EM field contribution to the element at the effect of the occluder.

Another aspect of the present disclosure features a method that includes obtaining respective primitive data of each of a plurality of primitives corresponding to an object in a three-dimensional (3D) space; obtaining respective geometric specular information for each of the plurality of primitives; and storing the respective geometric specular information with respective primitive data for each of the plurality of primitives.

In some implementations, the respective geometric specular information for each of the plurality of primitives includes a reflectivity of a surface of the primitive upon a viewing angle.

In some implementations, the method further includes determining a respective EM field contribution from each of the plurality of primitives to each of a plurality of elements of a display by taking into consideration of the respective geometric specular information for the primitive.

Another aspect of the present disclosure features a method that includes: obtaining graphic data comprising respective primitive data for a plurality of primitives corresponding to an object in a three-dimensional (3D) space; determining, for each of the plurality of primitives, an electromagnetic (EM) field contribution to each of a plurality of elements of a display by calculating, in a 3D coordinate system, an EM field propagation from the primitive to the element; generating, for each of the plurality of elements, a sum of the EM field contributions from the plurality of primitives to the element; transmitting, for each of the plurality of elements, a respective control signal to the element, the control signal being for modulating at least one property of the element based on the sum of the EM field contributions to the element; and transmitting a timing control signal to an illuminator to activate the illuminator to illuminate light on the display such that the light is caused by the modulated elements of the display to form a volumetric light field corresponding to the object.

Another aspect of the disclosure features a method that includes: for each of a plurality of elements of a display, altering a respective control signal with a predetermined calibration value; applying the respective altered respective control signals to the plurality of elements of the display; measuring an output of light incident on the display; and evaluating the predetermined calibration value based on the measurement of the output of the light.

In some implementations, the predetermined calibration value is the same for each of the plurality of elements.

In some implementations, the method further includes converting the respective control signals of the plurality of elements by a digital-to-analog converter (DAC), wherein altering the respective control signals for the plurality of elements includes altering digital signals of the respective control signals with the predetermined calibration value.

In some implementations, the predetermined value comprises a plurality of bits.

In some implementations, the method further includes adjusting the predetermined calibration value based on a result of the evaluation. Adjusting the predetermined calibration value can include modifying one or more values of the plurality of bits. Adjusting the predetermined calibration value can include determining a combination of values of the plurality of bits based on the predetermined calibration value and another calibration value determined from a previous evaluation.

In some implementations, the output of the light comprises a phase change of the light or an intensity difference between the output of the light and a background.

In some implementations, the respective control signal of the element is determined based on a sum of electromagnetic (EM) field contributions from a plurality of primitives corresponding to an object to the element in a 3D space.

Another aspect of the disclosure features a method that includes, for each of a plurality of elements of a display: obtaining a respective sum of electromagnetic (EM) field contributions from a plurality of primitives in a three-dimensional (3D) space, the plurality of primitives corresponding to an object in the 3D space; applying a respective mathematical transform to the respective sum of EM field contributions for the element to obtain a respective transformed sum of EM field contributions for the element; determining a respective control signal based on the respective transformed sum of EM filed contributions for the element; and modulating a property of the element based on the determined respective control signal for the element.

In some implementations, the method further includes: introducing light incident on the plurality of elements of the display; measuring a first output of the light; and adjusting one or more coefficients of the respective mathematical transforms of the plurality of elements based on a result of the measurement of the first output of the light. The method can further include: changing a depth of a holographic pattern corresponding to the object in view of the display; measuring a second output of the light; and adjusting the one or more coefficients of the respective mathematical transforms based on the first and second outputs. The method can further include: changing the plurality of primitives corresponding to a first holographic pattern to a second plurality of primitives corresponding to a second holographic pattern; measuring a second output of the light; and adjusting the one or more coefficients of the respective mathematical transforms based on the first and second outputs. The first holographic pattern and the second holographic pattern can correspond to the object. The second holographic pattern can correspond to a second object different from the object related to the first holographic pattern. The first output of the light can be measured by an imaging sensor. The imaging sensor can be configured to use a machine vision algorithm to determine what is being displayed and calculate a fitness parameter. Each of the first and second holographic patterns can include a grid of dots, wherein the fitness parameter is at least one of: how close the dots are together; how centered the dots are positioned, and how much distortion the dots are.

In some implementations, the mathematical transform is derived from a Zernike polynomial expression.

In some implementations, the mathematical transforms for the plurality of elements vary element-by-element.

In some implementations the method further includes: reproducing a sample set of known colors and intensities by illuminating the display; measuring an output light using a colorimeter device calibrated to CIE standard observer curves; and defining the output light of the display in CIE XYZ color space. The method can further include: determining a deviation of values of the defined output light from known standard values; and adapting output colors on the display to bring them back into alignment.

Another aspect of the disclosure features a method that includes: determining a cell gap of a liquid crystal (LC) display based on a pitch of display elements of the LC display; and calculating a minimum value of a birefringence of LC mixture based on the cell gap and a predetermined retardance for the LC display.

In some implementations, the method further includes improving a switching speed of the LC display with keeping the birefringence of LC mixture above the minimum value. Improving the switching speed can include at least one of: increasing dielectric anisotropy of the LC mixture; and decreasing the rotational viscosity of the LC mixture.

In some implementations, the LC display includes a liquid crystal on silicon (LCOS) device having a silicon backplane.

In some implementations, the LC display includes: a liquid crystal layer; a transparent conductive layer on top of the liquid crystal layer as a common electrode; and a backplane comprising a plurality of metal electrodes on bottom of the liquid crystal layer, wherein each of the plurality of metal electrodes is isolated from each other, and the backplane is configured to control a voltage of each of the plurality of metal electrode.

Another aspect of the disclosure features a display that includes: a backplane; and a plurality of display elements on the backplane, wherein at least two of the plurality of display elements have different sizes.

In some implementations, a larger one of the at least two display elements comprises a buffer, and a smaller one of the at least two display elements comprises no buffer. The larger display element can be connected with a first plurality of display elements by a conductive line, wherein the buffer is configured to buffer a voltage applied on the conductive line such that the voltage is only applied to a second plurality of display elements within the first plurality of display elements, a number of the second plurality of display elements being smaller a number of the first plurality of display elements.

In some implementations, the buffer comprises an analog circuit in a form of a transistor or a digital circuit in a form of logic gates.

In some implementations, a size distribution of the plurality of display elements is substantially identical to a size of a smaller one of the at least two display elements.

In some implementations, the display is configured to be a liquid crystal on silicon device.

Another aspect of the disclosure features a display that includes: a backplane; and a plurality of display elements on the backplane, wherein at least two of the plurality of display elements have different shapes.

In some implementations, the backplane includes a respective circuit for each of the display elements, wherein the respective circuits for the at least two display elements have shapes corresponding to the different shapes of the at least two display elements.

In some implementations, a size distribution of the plurality of display elements is substantially identical to a predetermined size.

In some implementations, the display is configured to be a liquid crystal on silicon device.

Another aspect of the present disclosure features a method including: obtaining graphic data including respective primitive data for a plurality of primitives corresponding to an object in a three-dimensional (3D) space; determining, for each of the plurality of primitives, an electromagnetic (EM) field contribution to each of a plurality of elements of a display by calculating, in a 3D coordinate system, an EM field propagation from the primitive to the element; generating, for each of the plurality of elements, a sum of the EM field contributions from the plurality of primitives to the element; transmitting, for each of the plurality of elements, a respective control signal to the element, the control signal being for modulating at least one property of the element based on the sum of the EM field contributions to the element; and transmitting a timing control signal to an illuminator to activate the illuminator to illuminate light on the display such that the light is caused by the modulated elements of the display to form a volumetric light field corresponding to the object.

Other embodiments of the aspects include corresponding computer systems, apparatus, and computer programs recorded on one or more computer storage devices, each configured to perform the actions of the methods. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Another aspect of the present disclosure features a device that includes: one or more processors; and a non-transitory computer readable storage medium in communication with the one or more processors and storing instructions executable by the one or more processors and upon such execution cause the one or more processors to perform one or more of the methods disclosed herein.

Another aspect of the present disclosure features a non-transitory computer readable storage medium storing instructions executable by one or more processors and upon such execution cause the one or more processors to perform the method according to one or more of the methods disclosed herein.

Another aspect of the present disclosure features a display including a plurality of elements; and a controller coupled to the display and configured to perform one or more of the methods disclosed herein. The controller can include a plurality of computing units, each of the computing units being configured to perform operations on one or more primitives of a plurality of primitives correspond to an object in a three-dimensional (3D) space. In some implementations, the controller is locally coupled to the display, and each of the computing units is coupled to one or more respective elements of the display and configured to transmit a respective control signal to each of the one or more respective elements. The computing units can be configured to operate in parallel.

The controller can include at least one of an application-specific integrated circuit (ASIC), a field-programmable gate array (FPGA), a programmable gate array (PGA), a central processing unit (CPU), a graphics processing unit (GPU), or standard computing cells. The display can include a spatial light modulator (SLM) including a digital micromirror device (DMD) or a liquid crystal on silicon (LCOS) device. The display can be configured to be phase modulated, amplitude modulated, or phase and amplitude modulated. The controller can be coupled to the display through a memory buffer.

In some implementations, the system includes an illuminator arranged adjacent to the display and configured to emit light on the display. The illuminator can be coupled to the controller and configured to be turned on/off based on a control signal from the controller.

In some cases, the illuminator is coupled to the controller through a memory buffer configured to control amplitude or brightness of one or more light emitting elements in the illuminator. The memory buffer for the illuminator can have a smaller size than a memory buffer for the display. A number of the light emitting elements in the illuminator can be smaller than a number of the elements of the display. The controller can be configured to simultaneously activate the one or more light emitting elements of the illuminator.

The illuminator can be a coherent light source, a semi-coherent light source, or an incoherent light source. In some implementations, the illuminator is configured to emit a white light, and wherein the display is configured to diffract the white light into light with different colors. In some implementations, the illuminator includes two or more light emitting elements each configured to emit light with a different color. The controller can be configured to sequentially modulate the display with information associated with a first color during a first time period and modulate the display with information associated with a second color during a second, sequential time period, and the controller can be configured to control the illuminator to sequentially turn on a first light emitting element to emit light with the first color during the first time period and a second light emitting element to emit light with the second color during the second time period.

In some implementations, the illuminator is arranged in front of a surface of the display and configured to emit the light on the surface of the display with an incident angle within a range between 0 degree and 90 degree, and the emitted light is reflected from the surface of the display. In some cases, the emitted light from the illuminator includes collimated light. In some cases, the emitted light from the illuminator includes divergent light. In some cases, the emitted light form the illuminator includes semi-collimated light.

In some implementations, the illuminator is arranged behind a rear surface of the display and configured to emit a divergent light on the rear surface of the display, and the emitted light is transmitted through the display and out of the display from a front surface of the display.

In some implementations, the illuminator includes: a light source configured to emit the light; and a waveguide coupled to the light source and arranged adjacent to the display, the waveguide being configured to receive the emitted light from the light source and guide the emitted light to the display. In some cases, the light from the light source is coupled to the waveguide from a side cross-section of the waveguide through a light coupler. In some cases, the light source and the waveguide are integrated in a planar form and positioned on a surface of the display. The waveguide can be configured to guide the light to illuminate the display uniformly.

In some cases, the waveguide is positioned on a rear surface of the display, and the light is guided to transmit through the display and diffracted out of the display from a front surface of the display. The controller can be positioned on a rear surface of the waveguide. In some cases, the waveguide is positioned on a front surface of the display, and wherein the light is guided to be incident on the front surface of the display and reflected by the front surface.

Another aspect of the present disclosure features a system including: a display including an array of elements; and an integrated circuit including an array of computing units, each of the computing units being coupled to one or more respective elements of the display and configured to: compute an electromagnetic (EM) field contribution from at least one primitive of a plurality of primitives to each of the array of elements; and generate, for each of the one or more respective elements, a respective sum of the EM field contributions from the plurality of primitives to the element.

Each of the computing units can be configured to: receive, from other computing units of the array of computing units, computed EM field contributions from other primitives of the plurality of primitives to each of the one or more respective elements; and generate, for each of the one or more respective elements, the respective sum of the EM field contributions by adding the received computed EM field contributions from the other primitives to the element.

Each of the computing units can be configured to generate, for each of the one or more respective elements, a respective control signal to modulate at least one property of the element based on the respective sum of the EM field contributions to the element.

In some implementations, the integrated circuit includes a respective accumulator configured to store an accumulation result of the computed EM field contribution from the plurality of primitives to each of the elements of the display.

The integrated circuit can be configured to clean the accumulators at a beginning of a computation operation. In some examples, the integrated circuit includes a respective memory buffer for each of the elements, and the integrated circuit can be configured to accumulate the computed EM field contribution from the plurality of primitive to the element to obtain the respective sum of the EM field contributions as a final accumulation result in the respective accumulator and transfer the final accumulation result from the respective accumulator the respective memory buffer for the element.

In some implementations, the system further includes an illuminator positioned between the integrated circuit and the display and configured to receive a control signal from the integrated circuit and illuminate light on the display based on the control signal, and the integrated circuit, the illuminator, and the display can be integrated as a single unit.

A further aspect of the present disclosure features a system, including: a computing device configured to generate data including respective primitive data of a plurality of primitives corresponding to an object in a three-dimensional (3D) space; and the system as disclosed herein. The system is configured to receive the graphic data from the computing device and process the graphic data for presenting the object in the 3D space. The computing device can include an application programming interface (API) configured to create the primitives with the respective primitive data by rendering a computer generated (CG) model of the object.

In the present disclosure herein, the term "primitive" refers to a basic nondivisible element for input or output within a computing system. The element can be a geometric element or a graphical element. The term "hologram" refers to a pattern displayed on a display which contains amplitude information or phase information, or some combination thereof, regarding an object. The term "holographic reconstruction" refers to a volumetric light field (e.g., a holographic light field) from a display when illuminated.

The details of one or more implementations of the subject matter of this specification are set forth in the accompanying drawings and associated description. Other features, aspects, and advantages of the subject matter will become apparent from the description, the drawings, and the claims.

It is to be understood that various aspects of implementations can be combined in different manners. As an example, features from certain methods can be combined with features of other methods.

DESCRIPTION OF DRAWINGS

FIGS. 5A-5F show implementations of example systems for 3D displays.

DETAILED DESCRIPTION

Figure 1A:
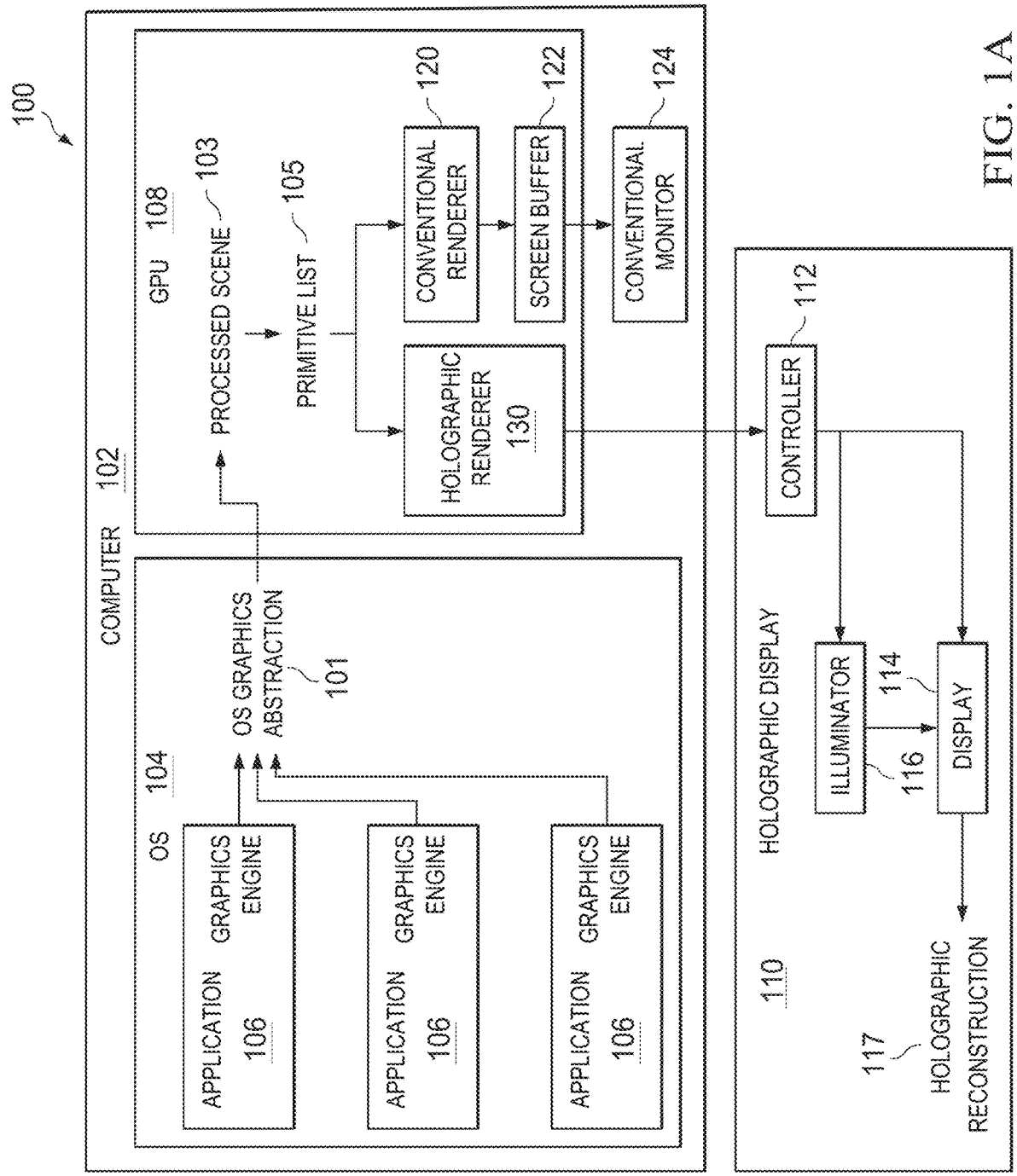
FIG. 1A illustrates a schematic diagram of an example system including a holographic display.

Implementations of the present disclosure feature technologies for enabling 3D displays of complex computer-generated scenes as genuine holograms. The technologies provide a novel and deterministic solution to real time dynamic computational holography based upon Maxwell's Equations for electromagnetic fields, which can be represented as Maxwell holography. The calculation (or computation) in the Maxwell holography can be represented as Maxwell holographic calculation (or Maxwell holographic computation). In embodiments, the disclosure approaches a hologram as a Dirichlet or Cauchy boundary condition problem for a general electric field, utilizing tools including field theory, topology, analytic continuation, and/or symmetry groups, which enables to solve for holograms in real time without the limitations of legacy holographic systems. In embodiments, the technologies can be used to make phase-only, amplitude-only, or phase-and-amplitude holograms, utilizing spatial light modulators (SLMs) or any other holographic devices.

Implementations of the present disclosure can provide: 1) a mechanism of approximation of a hologram as an electromagnetic boundary condition, using field theory and contact geometry, instead of classic optics; 2) derivation and implementation into computer codes and application programming interfaces (APIs) of the electromagnetic boundary condition approach to computational holography, that is, implementation of the hologram calculation as a 2D analytic function on a plane of the hologram and subsequent discretization into parallel algorithms; and/or 3) implementation of a complete set of fully 3D, holographic versions of standard computer graphics primitives (e.g., point, line, triangle, and texture triangle), which can enable full compatibility with standard existing computer graphics tools and techniques. The technologies can enable devices to display general existing content that is not specifically created for holography, and simultaneously allows existing content creators to create holographic works without having to learn special techniques, or use special tools.

Particularly, the technologies can involve the use of a mathematical formulation (or expression) of light as an electromagnetic (EM) phenomenon in lieu of the mathematical formulation of classical optics that is commonly used in computational holography, e.g., Gerchberg-Saxton (G-S) model. The mathematical formulation disclosed herein is derived from Maxwell's Equations. In embodiments, the technologies disclosed herein involve treating the displayed image as an electromagnetic field and treating a hologram as a boundary value condition that produces the electromagnetic field (e.g., a Dirichlet problem). Additionally, a desired image can be constructed using a primitive paradigm ubiquitous in computer graphics, allowing, for example, the technologies to be used to display any 3D imagery as a holographic reconstruction, e.g., a holographic light field, instead of as a projective image on a 2D screen. Compared to depth point clouds technologies that suffer from bandwidth limitations, the technologies can avoid these limitations and use any suitable types of primitives, e.g., a point primitive, a line primitive, or a polygon primitive such as a triangle primitive. Moreover, the primitives can be rendered with color information, texture information, and/or shading information. This can help achieve a recording and compression scheme for CG holographic contents including live holographic videos.

In embodiments, the technologies use Maxwell Equations to compute generated holograms as a boundary condition problem for modeling of an electromagnetic field, which can remove dependency on fast Fourier transform (FFT) and its inherent limitations, remove dependency on collimated light sources and lasers, and/or remove limitations of previous approaches to computational holography and non-deterministic solutions.

In embodiments, the technologies can be optimized for computational simplicity and speed through a mathematical optimization process that constrains independent inputs to a surface of the hologram, depending on parameters of computer-generated (CG) primitives needed to build the scene. This allows work to be performed in a highly parallel and highly optimal fashion in computing architectures, e.g., application specific integrated circuits (ASIC) and multicore architectures. The process of computing the hologram can be considered as a single instruction that executes on input data in a form of a computer-generated imagery (CGI) scene, and can theoretically be completed in a single clock cycle per CGI primitive.

In embodiments, the technologies treat a holographic scene as an assembly of fully 3D holographic primitive apertures which are functionally compatible with the standard primitives of conventional 3D graphics as employed in, for example, video games, movies, television, computer display, or any other computing display technologies. The technologies can enable efficient implementation of these aperture primitives in hardware and software without limitations inherent in standard implementations of computational holography. Amplitude and color of the primitives can be automatically computed. Computational complexity can increase linearly with phase element number n, compared to $n^2$ or $n*\log(n)$ in standard computational holography. The images created are fully 3D and not an assemblage of planar images, and the technologies do not require iterative amplitude correction with unknown step numbers. Moreover, the generated holograms do not have "conjugate" images that take up space on the holographic device.

As the holographic primitives are part of a special collection of mathematical objects, they can be relatively simple and relatively fast to compute, and they can be uniquely suited to parallel, distributed computing approaches. The computability and parallelism can allow for interactive computation of large holograms to design large area holographic devices of theoretically unlimited size, which can act as holographic computer displays, phone displays, home theaters, and even holographic rooms. Moreover, the holograms can fill large areas with light, e.g., rendering large shaded areas in 3D, without limitations associated with conventional holographic computation methods which can cause elements to appear in outline instead of solid. Furthermore, the relatively simple and relatively fast computation allows for the display of real-time holograms at interactive speeds that are not constrained by n^2 computational load and by iterative amplitude correction.

In embodiments, the technologies can realize natural computability on modern ASIC and multicore architectures and can realize complete compatibility with modern graphics hardware, modern graphics software, and/or modern graphics tools and tool chains. For example, the technologies can implement clear and simple holographic APIs and enable high performance rendering of arbitrary CG models using ordinary, standard 3D content creation tools, e.g., 3DS Max®, SolidWorks®, Maya®, or Unity3D, through the APIs. The APIs can enable developers or users to interact with a holographic device, e.g., a light modulator or holographic system. The holographic APIs can create computer graphics primitives as discrete holographic scene primitives, allowing for rich holographic content generation utilizing general purpose and specially designed holographic computation hardware. The creation of a mathematical and computational architecture can allow holograms to be rendered using the tools and techniques used to make conventional 3D content and software applications. The optimization of the mathematical and computational architecture can allow for performant embodiments of conventional graphics and rendering to be displayed as holographic reconstructions.

Algorithms in the technologies are relatively simple to implement in hardware. This not only allows the computational speeds needed for high quality, modern rendering that users expect, but it also allows the algorithms to be implemented in relatively simple circuits, e.g., ASIC gate structures, as part of a holographic device. Accordingly, bandwidth issues that can plague high density displays may become irrelevant, as computation of scenes can be spread across the computing architecture built into the display device (e.g., built-in-computation) instead of having to be computed remotely then written to each and every pixel of the display for each and every frame of content. It also means that the number of display elements, and thus the size of a holographic display, can be relatively unbound by constraints that limit other technologies.

The technologies can enable multiple interactive technologies using structured light to be implemented relatively simply and relatively inexpensively in different applications, including, for example, solid-state light detection and ranging (LiDar) devices, 3D printing, smart illuminators, smart microdisplays, or any other applications demanding structured light. The technologies can be also used for optical simulations, e.g., for grating simulations.

FIG. 1A illustrates a schematic diagram of an example system 100 for 3D displays. The system 100 includes a computing device 102 and a holographic display device (or a Maxwell holographic display device) 110. The computing device 102 is configured to prepare data for a list of primitives corresponding to an object, e.g., a 3D object, and transmit the data to the holographic display device 110 via a wired or wireless connection, e.g., USB-C connection or any other high speed serial connection. The holographic display device 110 is configured to compute electromagnetic (EM) field contributions from the list of primitives to display elements of a display (e.g., a modulator) in the holographic display device 110, modulate the display elements with a pattern, e.g., a hologram, based on the computed EM field contributions on the display, and display upon illumination a light field corresponding to the object in 3D, e.g., a holographic reconstruction. Herein, the hologram refers to the pattern displayed on the display which contains amplitude information or phase information, or some combination thereof, regarding the object. The holographic reconstruction refers to a volumetric light field (e.g., a holographic light field) from the display when illuminated.

The computing device 102 can be any appropriate type of device, e.g., a desktop computer, a personal computer, a notebook, a tablet computing device, a personal digital assistant (PDA), a network appliance, a smart mobile phone, a smartwatch, an enhanced general packet radio service (EGPRS) mobile phone, a media player, a navigation device, an email device, a game console, or any appropriate combination of any two or more of these computing devices or other computing devices.

The computing device 102 includes an operating system (OS) 104 that can include a number of applications 106 as graphics engines. The applications 106 can process or render a scene, e.g., any arbitrary CG model using standard 3D content creation tools, e.g., 3DS Max®, SolidWorks®, Maya®, or Unity3D. The scene can correspond to a 3D object. The applications 106 can operate in parallel to render the scene to obtain OS graphics abstraction 101 which can be provided to a graphics processing unit (GPU) 108 for further processing. In some implementations, the OS graphics abstraction 101 is provided to the holographic display device 110 for further processing.

The GPU 108 can include a specialized electronic circuit designed for rapid manipulation of computer graphics and image processing. The GPU 108 can process the graphics abstraction 101 of the scene to get processed scene data 103 which can be used to obtain a list of primitives 105 indexed in a particular order. The primitives can include at least one of a point primitive, a line primitive, or a polygon primitive. In some implementations, the GPU 108 includes a video driver configured to generate the processed scene data 103 and the list of primitives 105.

In some implementations, the GPU 108 includes a conventional render 120, by which the list of primitives 105 can be rendered by conventional rendering techniques, e.g., culling and clipping, into a list of items to draw on a conventional monitor 124, e.g., a 2D display screen. The list of items can be sent via a screen buffer 122 to the conventional monitor 124.

In some implementations, the GPU 108 includes a holographic renderer 130 to render the list of primitives 105 into graphic data to be displayed by the holographic display device 110. The graphic data can include the list of primitives and corresponding primitive data. For example, the graphic data can include a hex code for each primitive.

In some implementations, the GPU 108 includes both the conventional render 120 and the holographic renderer 130. In some implementations, the GPU 108 includes the conventional renderer 120 and the holographic display device 110 includes the holographic renderer 130.

The corresponding primitive data for a primitive can also include color information (e.g., a textured color, a gradient color or both), texture information, and/or shading information. The shading information can be obtained by any customary CGI surface shading methods that involve modulating color or brightness of a surface of the primitive.

The primitive data of a primitive can include coordinate information of the primitive in a 3D coordinate system, e.g., Cartesian coordinate system XYZ, polar coordinate system, cylindrical coordinate system, and spherical coordinate system. As discussed with further detail below, the display elements in the holographic display device 110 can also have corresponding coordinate information in the 3D coordinate system. The primitives at coordinate locations can represent a 3D object adjacent to the display elements, e.g., in front of the display elements.

As an example, the primitive is a shaded line, e.g., a straight line that changes smoothly from one color to another across its span. The primitive needs four elements of data to be rendered: two end points, and color information (e.g., a RGB color value) at each end point. Assume that a hex code for the line is A0, and the line stretches from a first end point (0.1, 0.1, 0.1) to a second end point (0.2, 0.2, 0.2) in the 3D coordinate system, with the color ½ Blue: RGB=(0,0,128) at the first end point and the color full Red: RGB=(255,0,0) at the second end point. The holographic renderer determines how much and what kind of data to expect for each primitive. For the line, the primitive data for the shaded line in the primitive stream can be a set of instructions as below:

0xA0//hex code for the shaded line
0x3dccccd//first vertex at (0.1, 0.1, 0.1) float (single)
0x3dccccd
0x3dccccd
0x000080//first vertex color is (0, 0, 128)
0x3e4ccccd//second vertex at (0.2, 0.2, 0.2) float (single)
0x3e4ccccd
0x3e4ccccd
0xff0000//second vertex color is (255, 0, 0)

There is a total of 31 hex words in the primitive data for the shaded line primitive. Thus, it can be an extremely efficient way to transmit a complex scene, and the primitive data can further be compressed. Since each primitive is a deterministic Turing step, there is no need for terminators. Different from a traditional model where this line primitive is simply drawn on a 2D display screen, the primitive data for the line is transmitted to the holographic display device 110 that can compute a hologram and display a corresponding holographic reconstruction presenting a line floating in space.

In some implementations, the computing device 102 transmits non-primitive based data, e.g., a recorded light field video, to the holographic display device 110. The holographic display device 110 can compute sequential holograms to display the video as sequential holographic reconstructions in space. In some implementations, the computing device 102 transmits CG holographic content simultaneously with live holographic content to the holographic display device 110. The holographic display device 110 can also compute corresponding holograms to display the contents as corresponding holographic reconstructions.

As illustrated in FIG. 1A, the holographic display device 110 includes a controller 112 and a display 114. The controller 112 can include a number of computing units or processing units. In some implementations, the controller 112 includes ASIC, field programmable gate array (FPGA) or GPU, or any combination thereof. In some implementations, the controller 112 includes the holographic renderer 130 to render the list of primitives 105 into the graphic data to be computed by the computing units. In some implementations, the controller 112 receives the OS graphics abstraction 101 from the computing device 102 for further processing. The display 114 can include a number of display elements. In some implementations, the display 114 includes a spatial light modulator (SLM). The SLM can be a phase SLM, an amplitude SLM, or a phase and amplitude SLM. In some examples, the display 114 is a digital micro-mirror device (DMD) or a liquid crystal on silicon (LCOS) device. In some implementations, the holographic display device 110 includes an illuminator 116 adjacent to the display 114 and configured to emit light toward the display 114. The illuminator 116 can be a coherent light source, e.g., a laser, a semi-coherent light source, e.g., an LED (light emitting diode), or an incoherent light source.

Different from a conventional 3D graphics system, which takes a 3D scene and projects it onto a 2D display device, the holographic display device 110 is configured to produce a 3D output such as a holographic reconstruction 117 in a form of a light field, e.g., a 3D volume of color. In a hologram, each display element contributes to every part of the scene. That is, for the holographic display device 110, each display element needs to be modulated for every part of the scene, e.g., each primitive in the list of primitives generated by the GPU 108, for complete reproduction of the scene. In some implementations, modulation of certain elements may be omitted based on, for example, an acceptable level of accuracy in the reproduced scene.

In some implementations, the controller 112 is configured to compute an EM field contribution, e.g., phase, amplitude, or both, from each primitive to each display element, and generate, for each display element, a sum of the EM field contributions from the list of primitives to the display element. This can be done either by running through every primitive and accruing its contribution to a given display element, or by running through each display element for each primitive.

The controller 112 can compute the EM field contribution from each primitive to each display element based on a predetermined expression for the primitive. Different primitives can have corresponding expressions. In some cases, the predetermined expression is an analytic expression, as discussed with further detail below in relation to FIGS. 3A-3C. In some cases, the predetermined expression is determined by solving Maxwell Equations with a boundary condition defined at the display 114. The boundary condition can include a Dirichlet boundary condition or a Cauchy boundary condition. Then, the display element can be modulated based on the sum of the EM field contributions, e.g., by modulating at least one of a refractive index, an amplitude index, a birefringence, or a retardance of the display element.

If values of an EM field, e.g., a solution to the Maxwell Equations, at each point on a surface that bounds the field are known, an exact, unique configuration of the EM field inside a volume bounded by a boundary surface can be determined. The list of primitives (or a holographic reconstruction of a corresponding hologram) and the display 114 define a 3D space, and a surface of the display 114 forms a portion of a boundary surface of the 3D space. By setting EM field states (e.g., phase or phase and amplitude states) on the surface of the display 114, for example, by illuminating light on the display surface, the boundary condition of the EM field can be determined. Due to time symmetry of the Maxwell Equations, as the display elements are modulated based on the EM field contributions from the primitives corresponding to the hologram, a volumetric light field corresponding to the hologram can be obtained as the holographic reconstruction.

For example, a line primitive of illumination at a specific color can be set in front of the display 114. As discussed in further detail below with respect to in FIG. 3B, an analytic expression for a linear aperture can be written down as a function in space. Then the EM field contribution from the line primitive on a boundary surface including the display 114 can be determined. If EM field values corresponding to the computed EM field contribution are set on the display 114, due to time-symmetry of the Maxwell Equations, the same linear aperture used in the computation can appear at a corresponding location, e.g., a coordinate position of the linear primitive in the 3D coordinate system.

In some examples, as discussed in further detail below with respect to FIG. 3B, suppose that there is a line of light between two points A and B in the 3D space. The light is evenly lit and has an intensity I per line distance l. At each infinitesimal dl along the line from A to B, an amount of light proportional to I*dl is emitted. The infinitesimal dl can acts as a delta (point) source, and the EM field contribution from the infinitesimal dl to any point on a boundary surface around a scene corresponding to a list of primitives can be determined. Thus, for any display element on the display 114, an analytic equation that represents the EM field contribution at the display element from the infinitesimal segment of the line can be determined. A special kind of summation/integral that marches along the line and accrues the EM field contribution of the entire line to the EM field at the display element on the display can be determined as an expression. Values corresponding to the expression can be set at the display element, e.g., by modulating the display element and illuminating the display element. Then, through time reversal and a correction constant, the line can be created in the same location defined by points A and B in the 3D space.

In some implementations, the controller 112 is coupled to the display 114 through a memory buffer. The control signal 112 can generate a respective control signal based on the sum of the EM field contributions to each of the display elements. The control signal is for modulating the display element based on the sum of the EM field contributions. The respective control signals are transmitted to the corresponding display elements via the memory buffer.

In some implementations, the controller 112 is integrated with the display 114 and locally coupled to the display 114. As discussed with further detail in relation to FIG. 1B, the controller 112 can include a number of computing units each coupled to one or more respective display elements and configured to transmit a respective control signal to each of the one or more respective display elements. Each computing unit can be configured to perform computations on one or more primitives of the list of primitives. The computing units can operate in parallel.

In some implementations, the illuminator 116 is coupled to the controller 112 and configured to be turned on/off based on a control signal from the controller 112. For example, the controller 112 can activate the illuminator 116 to turn on in response to the controller 112 completing the computation, e.g., all the sums of the EM field contributions for the display elements are obtained. As noted above, when the illuminator 116 emits light on the display 114, the modulated elements of the display cause the light to propagate in different directions to form a volumetric light field corresponding to the list of primitives that correspond to the 3D object. The resulting volumetric light field corresponds to a solution of Maxwell's equations with a boundary condition defined by the modulated elements of the display 114.

In some implementations, the controller 112 is coupled to the illuminator 116 through a memory buffer. The memory buffer can be configured to control amplitude or brightness of light emitting elements in the illuminator. The memory buffer for the illuminator 116 can have a smaller size than a memory buffer for the display 114. A number of the light emitting elements in the illuminator 116 can be smaller than a number of the display elements of the display 114, as long as light from the light emitting elements can illuminate over a total surface of the display 114. For example, an illuminator having 64×64 OLEDs (organic light emitting diodes) can be used for a display having 1024×1024 elements. The controller 112 can be configured to simultaneously activate a number of lighting elements of the illuminator 116.

In some implementations, the illuminator 116 is a monochromatic light source configured to emit a monochromatic light, e.g., a red light, a green light, or a blue light. In some implementations, the illuminator 116 includes two or more light emitting elements each configured to emit light with a different color. For example, the illuminator 116 can include red, green, and blue lighting elements. To display a full-color 3D object, three separate holograms for red, green, and blue, can be computed. That is, three EM field contributions from corresponding primitives to the display elements can be obtained. The display elements can be modulated sequentially based on the three EM field contributions and the illuminator 116 can be controlled to sequentially turn on the red, green and blue lighting elements. Depending on temporal coherence-of vision effect in an eye of a viewer, the three colors can be combined in the eye to give an appearance of full color. In some cases, the illuminator 116 is switched off during a state change of the display image (or holographic reconstruction) and switched on when a valid image (or holographic reconstruction) is presented for a period of time. This can also depend on the temperal coherence of vision to make the image (or holographic reconstruction) appear stable.

In some implementations, the display 114 has a resolution small enough to diffract visible light, e.g., on an order of 0.5 µm or less. The illuminator 116 can include a single, white light source and the emitted white light can be diffracted by the display 114 into different colors for holographic reconstructions.

As discussed in further detail below with respect to FIGS. 5A-5F, there can be different configurations for the system 100. The display 114 can be reflective or transmissive. The display 114 can have various sizes, ranging from a small scale (e.g., 1-10 cm on a side) to a large scale (e.g., 100-1000 cm on a side). Illumination from the illuminator 116 can be from the front of the display 114 (e.g., for a reflective display) or from the rear of the display 114 (e.g., for a transmissive display). A planar waveguide can be used to evenly illuminate a surface of the display 114. In some implementations, the controller 112, the illuminator 116, and the display 114 can be integrated together as a single unit. The integrated single unit can include the holographic renderer 130, e.g., in the controller 112.

Figure 1B:
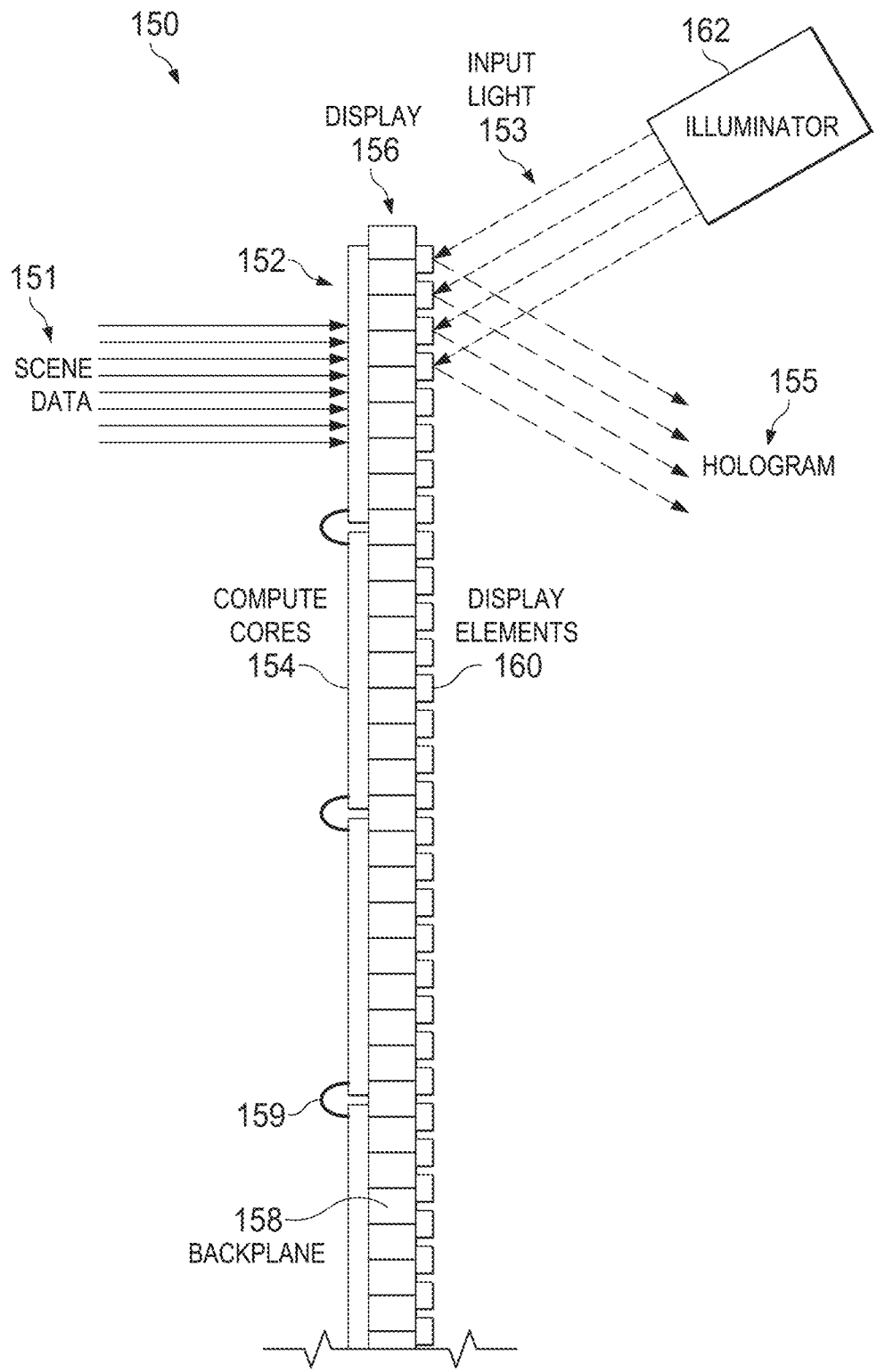
FIG. 1B illustrates a schematic diagram of an example holographic display.

FIG. 1B illustrates a schematic diagram of an example holographic display device 150. The holographic display device 150 can be similar to the holographic display device 110 of FIG. 1A. The holographic display device 150 includes a computing architecture 152 and a display 156. The computing architecture 152 can be similar to the controller 112 of FIG. 1A. The computing architecture 152 can include an array of parallel computing cores 154. A computing core can be connected to an adjacent computing core via a communication connection 159, e.g., a USB-C connection or any other high speed serial connection. The connections 159 can be included in a data distribution network through which scene data 151 (e.g., scene primitives) can be distributed among the computing cores 154.

The display 156 can be similar to the display 114 of FIG. 1A, and can include an array of display elements 160 positioned on a backplane 158. The display elements 160 can be arranged on a front side of the backplane 158 and the computing cores 154 can be arranged on a back side of the backplane 158. The backplane 158 can be a substrate, e.g., a wafer. The computing cores 154 can be either on the same substrate as the display 156 or bonded to the back side of the display 156.

Each computing core 154 can be connected to a respective tile (or array) of display elements 160. Each computing core 154 is configured to perform computations on respective primitives of a number of primitives in the scene data 151 in parallel with each other. In some examples, the computing core 154 is configured to compute an EM field contribution from each of the respective primitives to each of the array of display elements 160 and generate a sum of EM field contributions from the number of primitives to each of the respective tile of display elements 160. The computing core 154 can receive, from other computing cores of the array of computing cores 154, computed EM field contributions from other primitives of the number of primitives to each of the respective tile of display elements 160, and generate the sum of EM field contributions based on the received computed EM field contributions. The computing core 154 can generate a control signal for each of the respective tile of display elements to modulate at least one property of each of the respective tile of display elements 160 based on the sum of EM field contributions to the display element.

As noted above, the computing architecture 152 can also generate a control signal to an illuminator 162, e.g., in response to determining that the computations of the sums of the EM field contributions from the number of primitives to each of the display elements have been completed. The illuminator 162 emits an input light 153 to illuminate on the modulated display elements 160 and the input light 153 is reflected by the modulated display elements 160 to form a volumetric light field e.g., a holographic light field 155, corresponding to the scene data 151.

As illustrated in FIG. 1B, the tiles of display elements 160 can be interconnected into a larger display. Correspondingly, computing cores 154 can be interconnected for data communication and distribution. Note that a parameter that changes in the holographic calculations between any given two display elements is their physical locations. Thus, the task of computing the hologram can be shared between the corresponding computing cores 154 equally, and the entire display 150 can operate at the same speed as a single tile, independent of the number of tiles.

Figure 1C:
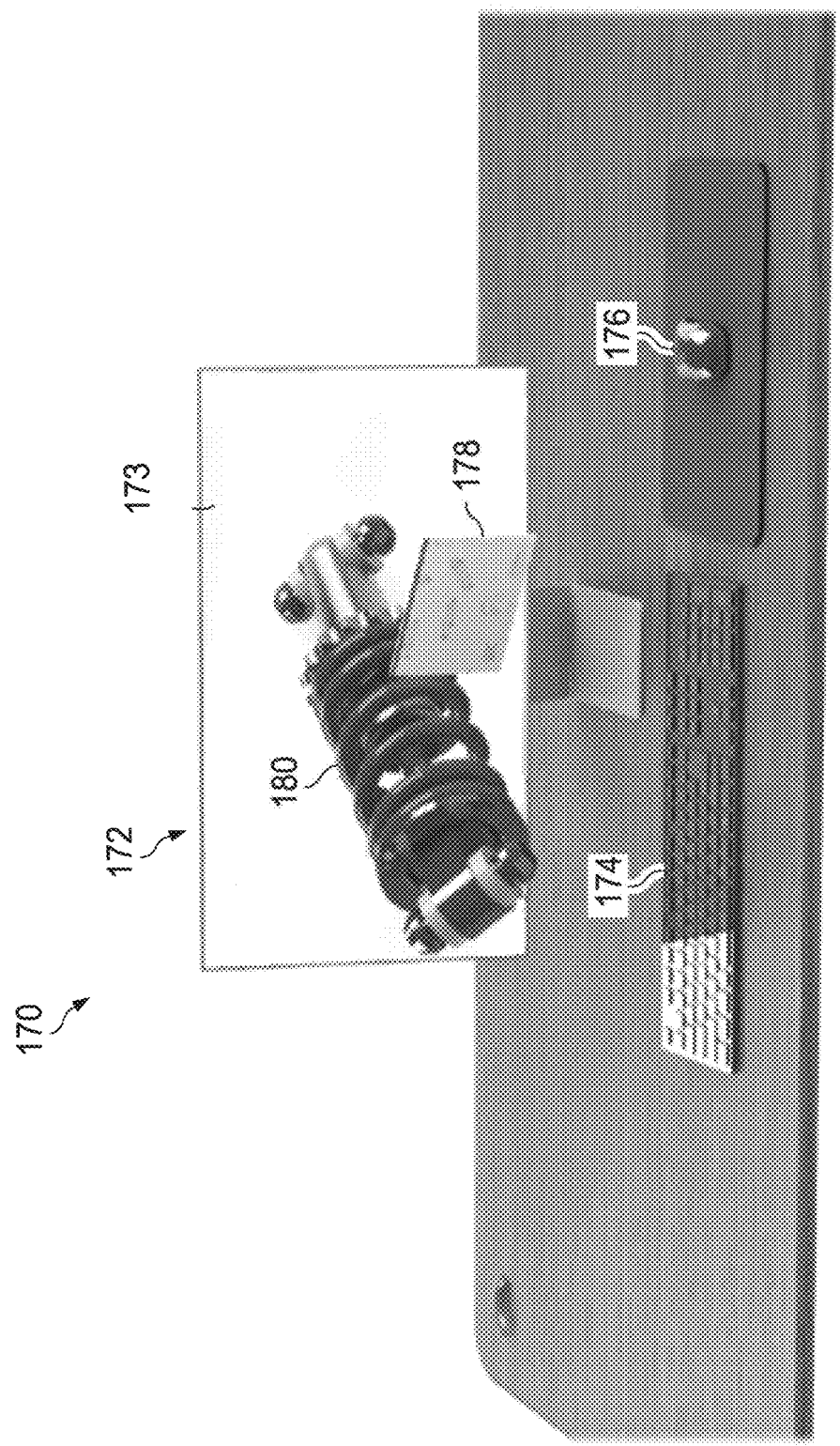
FIG. 1C illustrates an example system for 3D displays.

FIG. 1C illustrates an exemplary system 170 for displaying objects in a 3D space. The system 170 can include a computing device, e.g., the computing device 102 of FIG. 1A, and a holographic display device 172, e.g., the holographic display 110 of FIG. 1A or 150 of FIG. 1B. A user can use an input device, e.g., a keyboard 174 and/or a mouse 176, to operate the system 170. For example, the user can create a CG model for a 2D object 178 and a 3D object 180 through the computing device. The computing device or the holographic display device 172 can include a holographic renderer, e.g., the holographic renderer 130 of FIG. 1A, to render the CG model to generate corresponding graphic data for the 2D object 178 and the 3D object 180. The graphic data can include respective primitive data for a list of primitives corresponding to the objects 178 and 180.

The holographic display device 172 can include a controller, e.g., the controller 112 of FIG. 1A or 152 of FIG. 1B, and a display 173, e.g., the display 114 of FIG. 1A or 156 of FIG. 1B. The controller can compute a respective sum of EM field contributions from the primitives to each display element of the display 173 and generate control signals for modulating each display element based on the respective sum of EM field contributions. The holographic display device 172 can further include an illuminator, e.g., the illuminator 116 of FIG. 1A or the illuminator 162 of FIG. 1B. The controller can generate a timing control signal to activate the illuminator. When light from the illuminator illuminates on a surface of the display 173, the modulated display elements can cause the light to propagate in the 3D space to form a volumetric light field corresponding to a holographic reconstruction for the 2D object 178 and a holographic reconstruction for the 3D object 180. Thus, the 2D object 178 and the 3D object 180 are displayed as respective holographic reconstructions floating in the 3D space in front of the display 173.

In some implementations, the computing device transmits non-primitive based data, e.g., a recorded light field video, to the holographic display device 172. The holographic display device 172 can compute and generate corresponding holograms, e.g., a series of sequential holograms, to display as corresponding holographic reconstructions in the 3D space. In some implementations, the computing device transmits a CG holographic content simultaneously with live holographic content to the holographic display device 172. The holographic display device 172 can also compute and generate corresponding holograms to display the contents as corresponding holographic reconstructions in the 3D space.

Figure 2:
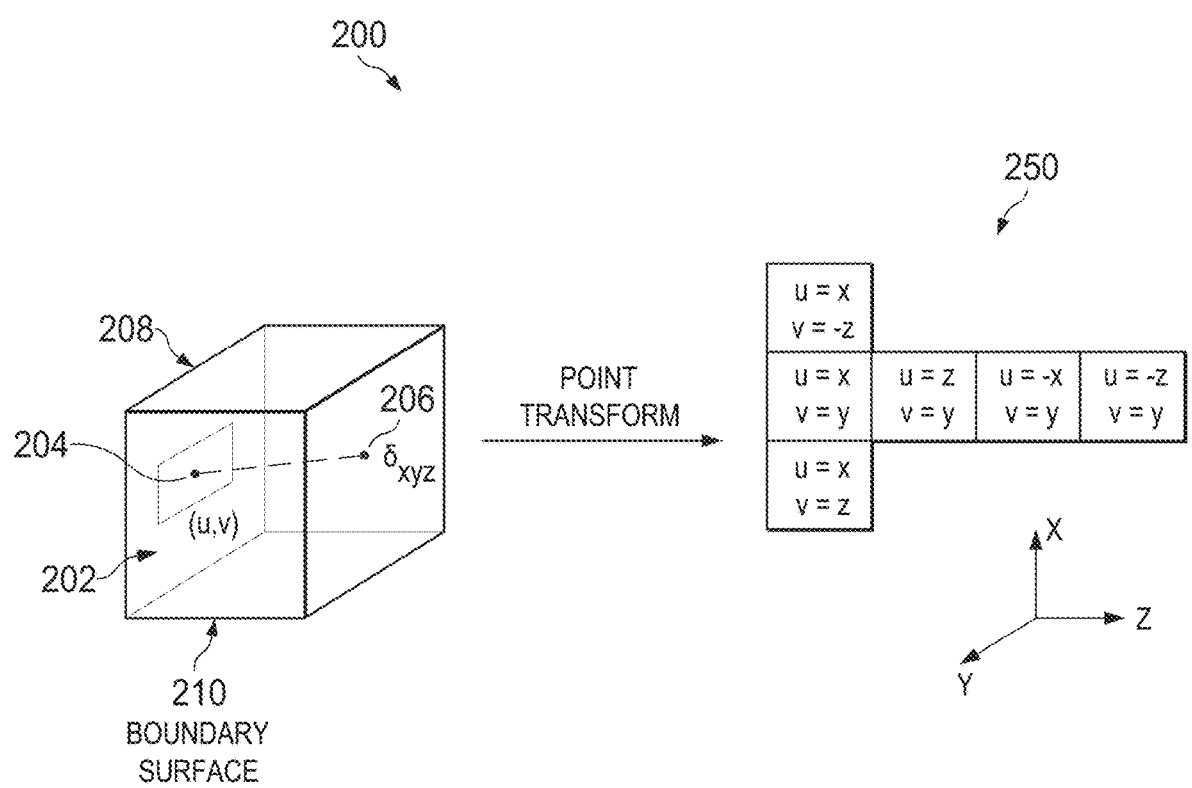
FIG. 2 illustrates an example configuration for electromagnetic (EM) propagation calculation.

FIG. 2 illustrates an exemplary configuration 200 for electromagnetic (EM) field calculation. A display 202, e.g., an LCOS device, including an array of elements 204 and a list of primitives including a point primitive 206 are in a 3D space 208. The 3D space 208 includes boundary surfaces 210. In a 3D coordinate system XYZ, the point primitive 206 has coordinate information (x, y, z). Each display element 204 lies in a flat plane with respect to other display elements 204 and has a 2D position (u, v). The display element 204 also has a location in the 3D space. By a mathematical point transformation, the 2D position (u, v) can be transferred into six coordinates 250 in the 3D coordinate system. That is, a surface of the display 202 forms a portion of the boundary surfaces 210. Thus, EM field contributions from the list of primitives to a display element computed by defining a boundary condition at the surface of the display 202 represent a portion of the total EM field contributions from the primitives to the display element. A scale factor, e.g., six, can be multiplied to a sum of the EM field contributions for each of the display elements to obtain a scaled sum of the field contributions, and the display element can be modulated based on the scaled sum of the field contributions.

Exemplary EM Field Contributions for Primitives

Primitives can be used for standard computer graphics rendering. Each type of primitive in standard computer graphics corresponds in this formulation to a discrete mathematical function that defines a single holographic primitive for a graphical element added to a hologram. Each type of primitive can correspond to an expression for calculating an EM field contribution to a display element. A primitive can be a point primitive, a line primitive, or a polygon (e.g., a triangle) primitive. As illustrated below, an analytic expression can be derived by calculating EM field propagation from a corresponding primitive to a display element of a display.

Figure 3A:
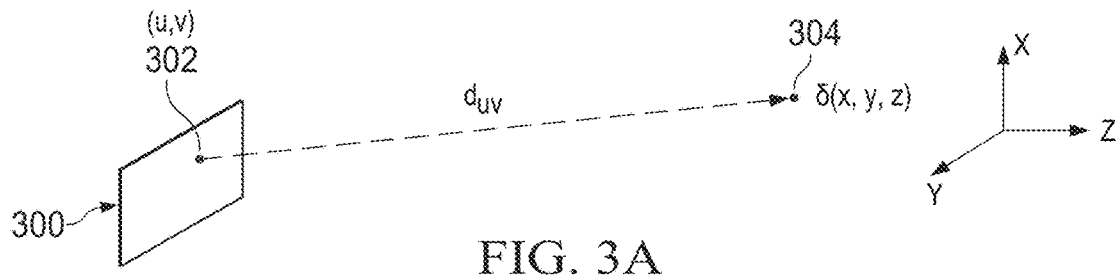
FIG. 3A illustrates an example EM propagation for a point primitive relative to an element of a display.

FIG. 3A illustrates an example EM propagation from a point primitive 304 to an element 302 of a display 300. In a 3D coordinate system XYZ, it is assumed that z coordinate is 0 across the display 300, which means negative z values are behind the display 300 and positive z values are in front of the display 300. The point primitive 304 has a coordinate (x, y, z), and the display element 302 has a coordinate (u, v, 0). A distance $d_{uv}$ between the point primitive 304 and the display element 302 can be determined based on their coordinates.

The point primitive 304 can be considered as a point charge with time varying amplitude. According to electromagnetic theory, an electric field E generated by such a point charge can be expressed as:

$$|E| \propto \frac{\exp(i2\pi d/\lambda)}{d^2}, \quad (1)$$

where $\lambda$ represents a wavelength of an EM wave, and d represents a distance from the point charge.

Thus, the electric field $E_{u,v}$ at the display element (u,v) can be expressed as:

$$|E_{u,v}| \propto \frac{I}{d_{uv}^2} \exp(i2\pi d_{uv}/\lambda), \quad (2)$$

where I represents a relative intensity of the holographic primitive electric field at the display element contributed from the point primitive 304.

As discussed above with respect to FIG. 2, a surface of the display 300 forms only a portion of a boundary surface for the EM field. A scale factor $\delta$ can be applied to the electric field $E_{u,v}$ to get a scaled electric field $E_\varphi(u, v)$ at the display element that adjusts for the partial boundary as follows:

$$E_\varphi(u, v) \propto \frac{\delta I}{d_{uv}^2} \exp(i2\pi d_{uv}/\lambda), \quad (3)$$

where $\delta \cong [6+\varepsilon]$, $0 < \varepsilon \le 1$.

Figure 3B:
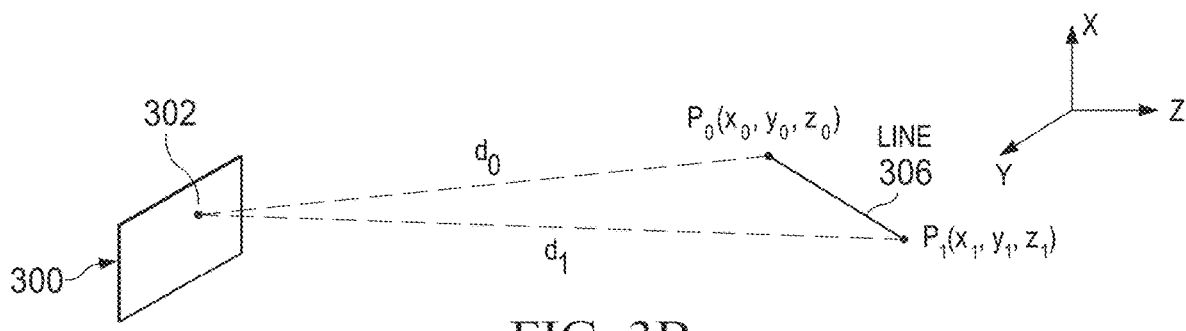
FIG. 3B illustrates an example EM propagation for a line primitive relative to an element of a display.

FIG. 3B illustrates an example of EM propagation from a line primitive 306 to the display element 302 of the display 300 in the 3D coordinate system XYZ. As noted above, the display element 302 can have a coordinate (u, v, 0), where z=0. The line primitive 306 has two endpoints $P_0$ with coordinate $(x_0, y_0, z_0)$ and $P_1$ with coordinate $(x_1, y_1, z_1)$. A distance $d_0$ between the endpoint $P_0$ and the display element can be determined based on their coordinates. Similarly, a distance $d_1$ between the endpoint $P_1$ and the display element can be determined based on their coordinates. A distance $d_{01}$ between the two endpoints $P_0$ and $P_1$ can be also determined, e.g., $d_{01} = d_1 - d_0$.

As discussed above, a line primitive can be treated as a superposition or a linear deformation, and a corresponding analytic expression for the line primitive as a linear aperture can be obtained as a distributed delta function in space. This analytic expression can be a closed expression for continuous 3D line segments as holograms.

Figure 3C:
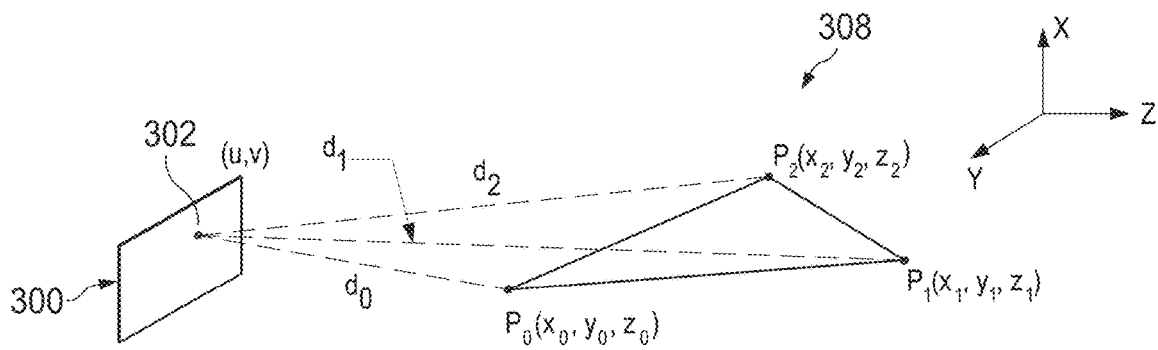
FIG. 3C illustrates an example EM propagation for a triangle primitive relative to an element of a display.

FIG. 3C illustrates an example EM propagation from a triangle primitive 308 to the display element 302 of the display 300 in the 3D coordinate system XYZ. As noted above, the display element 302 can have a coordinate (u, v, 0), where z=0. The triangle primitive 308 has three endpoints: $P_0$ $(x_0, y_0, z_0)$, $P_1$ $(x_1, y_1, z_1)$, and $P_2$ $(x_2, y_2, z_2)$. Distance $d_0$, $d_1$, and $d_2$ between the display element and the endpoints $P_0$, $P_1$, and $P_2$ can be respectively determined based on their coordinates.

Similar to the line primitive in FIG. 3B, the triangle primitive can be treated as a continuous aperture in space and an analytical expression for the EM field contribution of the triangle primitive to the display element can be obtained by integration. This can be simplified to obtain an expression for efficient computation.

Exemplary Computations for Primitives

As discussed above, a controller, e.g., the controller 112 of FIG. 1A, can compute an EM field contribution from a primitive to a display element based on an analytical expression that can be determined as shown above. As an example, the EM field contribution for a line primitive is computed as below.

Each display element in a display has a physical location in space, and each display element lies in a flat plane with respect to other display elements. Assuming that the display elements and their controllers are laid out as is as customary in display and memory devices, a simple mathematical point transformation can be used to transform a logical location of a given display element based on a logical memory address for the display element in a processor to an actual physical location of the display element in the space. Therefore, as the logical memory addresses of the display elements are looped in a logical memory space of the processor, corresponding actual physical locations in the space across the surface of the display can be identified.

As an example, if the display has a 5 μm pitch, each logical address increment can move 5 μm in the x direction, and when x resolution limit of the display is reached, the next increment will move back to the initial x physical location and increment the y physical location by 5 μm. The third spatial coordinate z can be assumed to be zero across the display surface, which means that the negative z values are behind the display, and the positive z values are in front of the display.

To begin the line calculation, a type of scaled physical distance between the current display element and each of the two points of the line primitive can be determined to be d0 and d1. As a matter of fact, d0 and d1 can be calculated once per primitive, as every subsequent calculation of the distances across display elements is a small perturbation of an initial value. In this way, this computation is performed in one dimension.

An example computation process for each primitive can include the following computation codes:

$DD=f(d1,d0)$, $iscale=SS*COLOR*Alpha1$, $C1=-2*iscale*\sin(DD/2)*\sin((Alpha2)*\cos(Alpha3)$, $C2=-2*iscale*\sin(DD/2)*\sin(Alpha2)*\sin(Alpha4)$, where SS, Alpha1, Alpha2, Alpha3, and Alpha4 are pre-computed constants, COLOR is the RGB color value passed in with the primitive, and all values are scalar, single precision floats. Both the sine and cosine functions can be looked up in tables stored in the controller to improve computation efficiency.

The results in C1 and C2 are then accumulated for each primitive at each display element, e.g., in an accumulator for the display element, and can be normalized once at the end of the computations for the display elements. At this point, as noted above, the controller can transmit a first control signal to the display elements to modulate the display elements based on the computed results and a second control signal to an illuminator to turn on to emit light. Accordingly, a holographic reconstruction (or a holographic light field) is visible to a viewer. When illuminated, the modulated display elements can cause the light to produce a crisp, continuous color line in three dimensional space.

In some implementations, the computation codes include a hex code for cleaning previous accumulations in the accumulator, e.g., at the beginning of the codes. The computation codes can also include a hex code for storing the accumulator results into a respective memory buffer for each display element, e.g., at the end of the codes. In some implementations, a computing device, e.g., the computing device 102 of FIG. 1A, transmits a number of background or static primitive hex codes to the controller at an application startup or an interval between displaying frames that does not affect a primary display frame rate. The computing device can then transmit one or more combinations of the hex codes potentially along with other foreground or dynamic primitives at a much higher rate to the controller that can form a corresponding control signal to modulate the display elements of the display.

The computation process can be orders of magnitude simpler and faster than the most efficient line drawing routines in conventional 2D display technology. Moreover, this computation algorithm scales linearly with the number of display elements. Thus, scaling computing units of the controller as a 2D networked processing system can keep up with computation needs of an increasing surface area of the display.

Exemplary Computation Implementations

A Maxwell holographic controller, e.g., the controller 112 of FIG. 1A, can compute an EM field contribution from a primitive to a display element based on an analytical expression that can be determined as shown above. The controller can be implemented in, for example, ASIC, FPGA or GPU, or any combination thereof.

In a modern GPU pipeline, a GPU takes descriptions of geometric figures as well as vertex and fragment shader programs to produce color and depth pixel outputs to one or more output image surfaces (called render targets). The process involves an explosive fan-out of information where geometry is expanded into shading fragments, followed by a visibility test to select whether work needs to be done on each of these fragments. A fragment is a record that contains all the information involved to shade that sample point, e.g., barycentric coordinates on the triangle, interpolated values like colors or texture coordinates, surface derivatives, etc. The process of creating these records then rejecting those that do not contribute to the final image is the visibility test. Fragments that pass the visibility test can be packed into work groups called wavefronts or warps that are executed in parallel by the shader engines. These produce output values that are written back to memory as pixel values, ready for display, or for use as input textures for later rendering passes.

In Maxwell holography, the rendering process can be greatly simplified. In Maxwell holographic calculations, every primitive contributes to every display element. There is no need to expand geometry into pixels and no need to apply visibility tests before packing wavefronts. This can also remove the need for decision making or communication between Maxwell holographic pipelines and allow computation to become a parallel issue with a number of possible solutions each one tuned to speed, cost, size or energy optimization. The graphics pipeline is significantly shorter with less intermediate steps, no data copying or movement, and less decisions leading to lower latency between initiating a draw and the result being ready for display. This can allow Maxwell holographic rendering to create extremely low latency displays. As discussed below, this can allow Maxwell holographic calculations to increase accuracy, for example, by using fixed point numbers in the Maxwell holographic pipeline, and to optimize computation speed, for example, by optimizing mathematical functions.

Using Fixed Point Numbers

When calculating an EM contribution from each primitive at each display element (e.g., phasel), intermediate calculations involve producing very large numbers. These large numbers involve special handling as they also need to retain the fractional parts during the calculation.

Floating point values have the disadvantage that they are most accurate close to the origin (zero on the number line) and lose one bit of accuracy every power-of-two when moving away from the origin. For numbers close in the range [−1,1], the accuracy of floating point values can be exquisite, but once reaching numbers in the tens of millions, e.g., reaching the point where single-precision 32-bit IEEE-754 floating point values have no fractional digits remaining, the entire significand (a.k.a mantissa) is used to represent the integer part of the value. However, it is the fractional part of large numbers that Maxwell holography is particularly interested in retaining.

In some cases, fixed point numbers are used in the Maxwell holographic calculations. Fixed point number representations are numbers where the decimal point does not change on a case-by-case basis. By choosing the correct numbers of bits for the integer and fractional parts of a number, the same number of fractional bits can be obtained regardless of the magnitude of the number. Fixed point numbers are represented as integers with an implicit scale factor, e.g., 14.375 can be represented as the number 3680 (0000111001100000 base-2) in a 16-bit fixed point value with 8 fractional bits. This can be also represented as an "unsigned 16.8" fixed point number, or u16.8 for short. Negative numbers can have one additional sign bit and are stored in "2s compliment" format. In such a way, the accuracy of the calculation can be greatly improved.

Optimization to Mathematical Functions

As shown above, Maxwell holographic calculations involve the use of transcendental mathematical functions, e.g., sine, cosine, arc tangent, etc. In a CPU, these functions are implemented as floating point library functions that may use specialized CPU instructions, or on a GPU as floating point units in the GPU. These functions are written to take arguments as a floating point number and the results are returned in the same floating point representation. These functions are built for the general case, to be accurate where floats are accurate, to be correctly rounded and to cope with every edge case in the floating point number representation (+/−Infinity, NaN, signed zero and denormal floats).

In Maxwell holographic calculations, with the fixed point representation, there is no need to use denormal floats for gradual underflow, no handling NaN results from operations like division by zero, no altering the floating point rounding modes, and no need to raise floating point exceptions to the operating system. All of these allow simplifying (and/or optimizing) the transcendental mathematical functions, for example, as discussed below.

In some cases, optimizations can be made to take arguments in one fixed point format and return the value to a different level of accuracy, e.g., input s28.12 and output s15.14. This can be especially desirable when calculating the sine of large values in the 10s of millions, the input argument may be large but the output can only need to represent the value range [−1,1], or arctangent which takes in any value but return values in the range [−π/2, π/2].

In some cases, optimization can be made to freely implement the transcendental functions as fully enumerated look-up tables, interpolated tables, as semi-table based polynomial functions or as semi-table based full minimax polynomials depending on the input range involved. It also allows to apply specialized range reduction methods that cope with large inputs, which the general purpose GPU pipeline calculation may skip for speed.

In some cases, another optimization can be transforming trigonometric calculations from the range [−π, π] into a signed 2's compliment representation in the range [−1,1] which has the advantage of not requiring expensive modulo 2π division operations.

Exemplary Implementations for Occlusion

Occlusion is often viewed as a difficult and important topic in computer graphics, and even more so in computational holography. This is because, in at least some cases, while the occlusion problem in projective CGI is static, what is hidden and what is visible in holographic systems depend on the location and direction of a viewer. Wave approaches of G-S holography or its derivatives have been developed to address the holographic occlusions. However, masking or blocking contributions from parts of a scene that are behind other parts of a scene can be very complicated and computationally expensive in the G-S methodology.

In Maxwell holography, the occlusion issue can be addressed comparatively easily, because which display elements (e.g., phasels) correspond to which primitives is completely deterministic and trivial. For example, whether or not a given display element contributes to a reconstruction of a given primitive can be determined as the calculation for the given primitive is performed. After determining that a number of display elements do not contribute to the given primitive due to occlusion, when calculating a sum of EM contributions to one of the number of display elements, the EM contribution from the given primitive is omitted from the calculation of the sum of EM contributions to the one of the number of display elements.

Figure 3D:
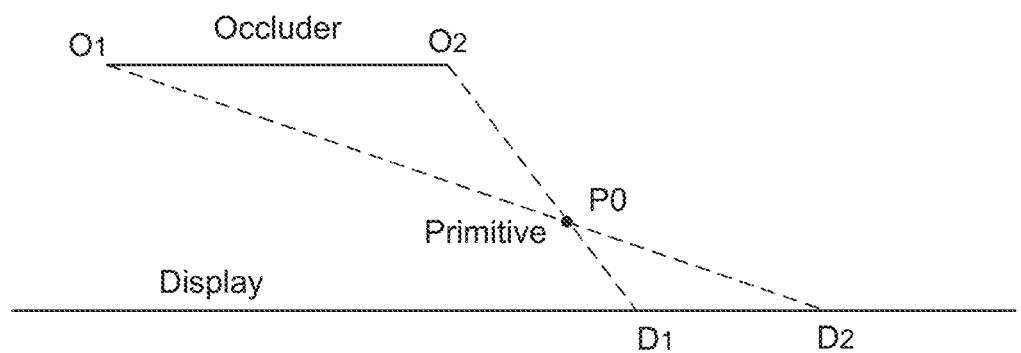
FIG. 3D illustrates an example implementation of Maxwell holographic occlusion for a point primitive with a line primitive as an occluder.
Figure 3E:
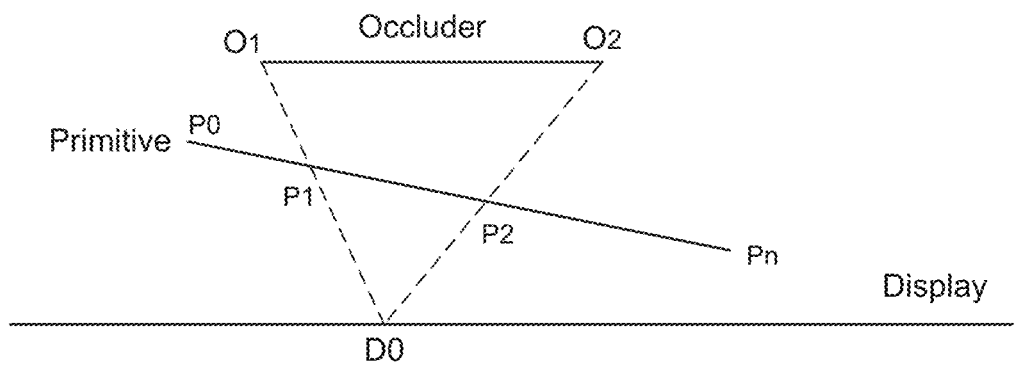
FIG. 3E illustrates an example implementation of Maxwell holographic occlusion for a line primitive with another line primitive as an occluder.
Figure 3F:
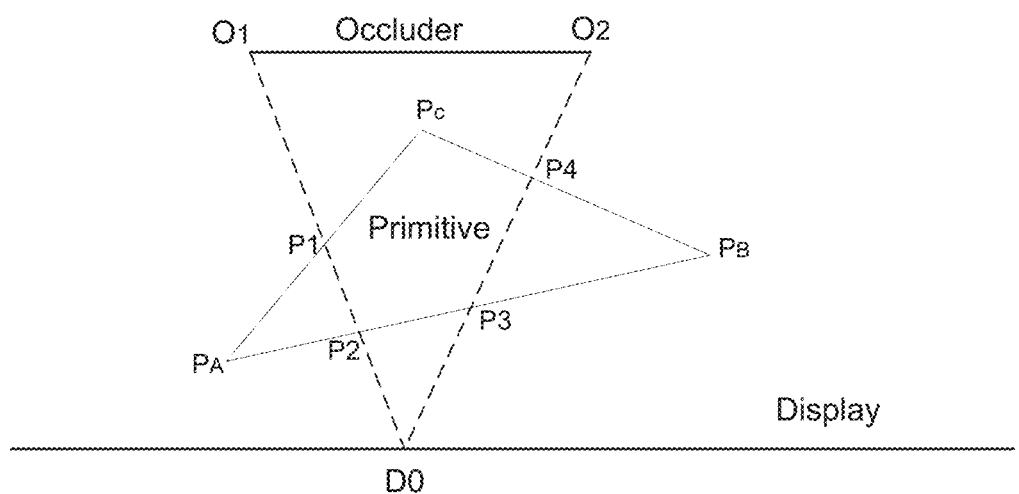
FIG. 3F illustrates an example implementation of Maxwell holographic occlusion for a triangle primitive with a line primitive as an occluder.

For illustration only, FIGS. 3D-3F show a determination of display elements not contributing to a given primitive (a point in FIG. 3D, a line in FIG. 3E, and a triangle in FIG. 3F) with a line primitive as an occluder. The line primitive has a starting point O1 and an ending point O2.

As illustrated in FIG. 3D, a point primitive P0 is behind the occluder and closer to the display. By extending lines connecting O1-P0 and O2-P0, a range of display elements from D1 to D2 in the display is determined, which do not contribute to the reconstruction of the point primitive P0.

In some examples, the coordinate information of O1, O2, and P0 is known, e.g., stored in a "Z" buffer calculated by a GPU (e.g., the GPU 108 of FIG. 1A) prior to the scene being transmitted to the Maxwell holographic controller (e.g., the controller 112 of FIG. 1A). For example, in an XZ plane with y=0, the coordinate information can be O1 (Ox1, Oz1), O2 (Ox2, Oz2), and P0 (Px, Pz), with Oz1=Oz2=Oz. Based on the coordinate information, the coordinate information of D1 and D2 can be determined to be $$Dx1=Px+\rho(Px-Ox2), Dx2=Dx1+\rho(Ox2-Ox1) \quad (4),$$

where $\rho=Pz/(Oz-Pz)$, and $Dz1=Dz2=0$.

The information of D1 and D2 can be stored as additional information in an "S" buffer for the Maxwell holographic controller, besides the information in a Z buffer for the point primitive P0. In such a way, the additional information can be used to trivially mask the contributions of specific display elements (within the range from D1 to D2) to the specific primitive P0 in the indexed primitive list.

FIG. 3E illustrates a determination of how a specific display element contributes to a line primitive with an occluder before the line primitive. By connecting the specific display element D0 to the starting point O1 and the ending point O2 of the occluder, two point primitives P1 and P2 on the line primitive are determined as the intersection points. Thus, the specific display element D0 does not contribute to the reconstruction of the part of the line primitive from P1 to P2 on the line primitive. Accordingly, when calculating the sum of EM contributions to the specific display element D0, the EM contributions from the part P1-P2 of the line primitive is not calculated.

This can be implemented in two ways. In the first way, the EM contributions from the part P0-P1 and the part P2-Pn to the specific display element D0 are summed as the EM contributions of the line primitive to the specific display element D0, by considering the occlusion from the occluder. In the second way, the EM contribution from the whole line primitive P0-Pn is calculated, together with the EM contribution from the part P1-P2, a difference between the two calculated EM contributions can be considered as the EM contribution of the line primitive to the specific display element D0 by considering the occlusion from the occluder. The coordinate information of P1 and P2 or the part P1-P2 can be stored, as the part of the line primitive that does not contribute to the specific display element D0, in the "S" buffer of the Maxwell holographic controller, together with the information of the occluder and other information in the "Z" buffer of the GPU.

FIG. 3F illustrates a determination of how a specific display element contributes to a triangle primitive with an occluder before the triangle primitive. By connecting the specific display element D0 to the starting point O1 and the ending point O2 of the occluder, four point primitives P1, P2, P3, and P4 on sides of the triangle primitive are determined as the intersection points. Thus, the specific display element D0 does not contribute to the reconstruction of the part of the triangle primitive enclosed by the points P1, P2, P3, P4, $P_C$. Accordingly, when calculating the sum of EM contributions to the specific display element D0, the EM contributions from the part P1-P2-P3-P4-$P_C$ of the triangle primitive is not calculated. That is, only the EM contributions from the first triangle formed by points $P_A$, P1 and P2 and the second triangle formed by points $P_B$, P3, and P4 are summed as the EM contribution of the triangle primitive $P_A$-$P_B$-$P_C$ by considering the occlusion of the occluder. The coordinate information of P1, P2, P3 and P4 or the triangle primitives $P_A$-P1-P2 and $P_B$-P3-P4 can be stored, as the part of triangle primitive $P_A$-$P_B$-$P_C$ that contributes to the specific display element D0, in the "S" buffer of the Maxwell holographic controller, together with the information of the occluder and other information in the "Z" buffer of the GPU.

The implementations of occlusion in Maxwell holography enables to convert the "Z" buffer in the GPU to the "S" buffer in the Maxwell holographic controller, and can mask the contributions of specific primitives (or specific parts of the primitives) in the indexed primitive list to a specific display element. This not only provides accurate, physically correct occlusion, it also saves computation time, as the primitives that do not contribute to a given display element and move on to computation for the next display element.

The "S" buffer can contain additional information related to diffraction efficiency of the display.

The "S" buffer can also include rendering features such as Holographic specular highlights, in which a reflectivity of a surface is dependent upon the viewing angle. In traditional CGI, specular highlights are dependent only on the orientation of the rendered object, whereas in a Maxwell holographic context, the direction from which the object is viewed also plays a part. Therefore, the geometric specular information can be encoded in the "S" buffer as an additive (specular) rather than a subtractive (occlusion) contribution. In Maxwell holography, the mathematics for holographic specular highlights can be substantially same as that for holographic occlusion.

Exemplary Implementations for Stitching

When light illuminates on a display modulated with EM contributions from a list of primitives of a 3D object, the modulated display causes the light to propagate in different directions to form a volumetric light field corresponding to the primitives. The volume light field is the Maxwell holographic reconstruction. Two adjacent primitives in the 3D object, e.g., triangle primitives, have a shared side. During the reconstruction, a stitching issue may raise, where the light intensity of the shared side can be double due to the reconstructions of the two adjacent primitives separately. This may affect the appearance of the reconstructed 3D object.

Figure 3G:
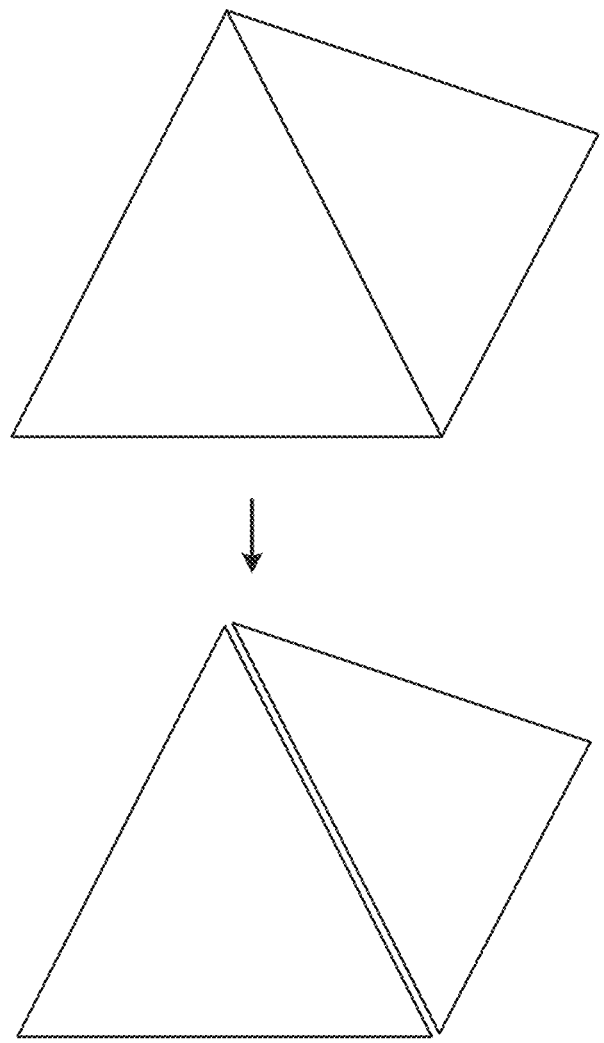
FIG. 3G illustrates an example implementation of Maxwell holographic stitching.

To address the stitching issue in Maxwell holography, as illustrated in FIG. 3G, the adjacent primitives can be scaled down by a predetermined factor, so that a gap can be formed between the adjacent primitives. In some cases, instead of scaling down the two adjacent primitives, only one primitive or a part of the primitive is scaled down. For example, a line of a triangle primitive can be scaled down to separate from another triangle primitive. In some cases, the scaling can include scaling different parts of a primitive with different predetermined factors. The scaling can be designed such that the gap is big enough to separate the adjacent primitives to minimize the stitching issue and small enough to make the reconstructed 3D object appear seamless. The predetermined factor can be determined based on information of the display, e.g., a maximum spatial resolution of the display.

In some cases, the scaling operation can be applied to primitive data of a primitive obtained from the holographic render, e.g., the holographic render 130 of FIG. 1A, and the scaled primitive data of the primitive is sent to the Maxwell holographic controller, e.g., the controller 112 of FIG. 1A. In some cases, the controller can perform the scaling operation on the primitive data obtained from the holographic render, before calculating EM contributions of the primitives to the display elements of the display.

Exemplary Implementations for Texture Mapping

Texture mapping is a technique developed in computer graphics. The basic idea is to take a source image and apply it as a decal to a surface in a CGI system, enabling detail to be rendered into the scene without the need for the addition of complex geometry. The texture mapping can include techniques for the creation of realistic lighting and surface effects in the CGI system, and can refer universally to the application of surface data to triangular meshes.

In Maxwell holography, flat shaded and also interpolated triangular meshes can be rendered in genuine 3D using the analytic relationship between arbitrary triangles in space and a phase map on a holographic device. However, to be compatible with modern rendering engines, the ability to map information on the surface of these triangles is involved. This can present a real problem, in that the speed of the method is derived from the existence of the analytic mapping, which does not admit data-driven amplitude changes.

Discrete Cosine Transform (DCT) is an image compression technique and can be considered as the real-valued version of the FFT (fast Fourier transform). DCT depends on an encode-decode process that assigns weights to cosine harmonics in a given image. The result of an encode is a set of weights equal in number to the number of pixels in the original image, and if every weight is used to reconstruct an image, there will be no loss in information. However, in many images, acceptable reconstructions can be made from a small subset of the weights, enabling large compression ratios.

The decode (render) process of the DCT in two dimensions involves a weighted double sum over every DCT weight and every destination pixel. This can be applied to Maxwell holography for texture mapping. In Maxwell holography, triangle rendering involves a "spiked" double integral, in phase space, to determine the phase contribution of any individual phasel to the triangle in question. The integral can be folded into a double sum which mirrors the one in the DCT reconstruction, and then re-derive the analytic triangle expression in terms of the DCT weights. This implementation of DCT technique in Maxwell holographic calculations enables to draw full, texture mapped triangles, to employ image compression to the data for the rendered texture triangles, and to take advantage of existing toolsets that automatically compress texture and image data using DCT/JPEG.

In some implementations, to draw a Maxwell holographic textured triangle, a spatial resolution desired for the mapping on a specified surface is first calculated. Then a texture with the resolution is supplied, and DCT compressed with angular and origin information to correctly orient it on the triangle is obtained. Then, the triangle corners and a list of DCT weights are included in the index primitive list and sent to the Maxwell holographic controller. The DCT weights can be included in the EM contributions of the triangle primitive to each display element. The texture triangle can be n times slower than a flat triangle, where n is the number of (nonzero) DCT weights that are sent with the primitive. Modern techniques for "fragment shading" can be implemented in the Maxwell holographic system, with the step of the DCT encode replacing the filter step for traditional projective rendering.

As an example, the following expression shows the DCT weights $B_{pq}$ for an image:

$$B_{pq} \equiv \sigma_p \sigma_q \sum_{m=0}^{M-1} \sum_{n=0}^{N-1} A_{mn} \cos\left[\frac{\pi(2m+1)p}{2M}\right] \cos\left[\frac{\pi(2n+1)q}{2N}\right], \quad (5)$$

$$\text{where } \sigma_p = \begin{cases} 1/\sqrt{M} & p=0 \\ \sqrt{2/M} & \text{else} \end{cases}, \sigma_q = \begin{cases} 1/\sqrt{N} & q=0 \\ \sqrt{2/N} & \text{else} \end{cases},$$

M and N are corners of a rectangular image, and (p, q) is a DCT term.

By decoding, the amplitude value $A_{mn}$ can be obtained as follows:

$$A_{mn} = \sum_{p=0}^{M-1}\sum_{q=0}^{N-1} \sigma_p \sigma_q A^*_{mn}, \quad (6)$$

where $A^*_{mn} = B_{pq} \cos\left[\dfrac{\pi(2m+1)p}{2M}\right] \cos\left[\dfrac{\pi(2n+1)q}{2N}\right]$.

When calculating the EM contribution of the textured triangle primitive to a display element (e.g., a phase), a DCT term with a corresponding DCT weight $A^*_{mn}$ can be included in the calculation as follows:

$$\varphi_{pq} = \Sigma_{y=0}^Y \Sigma_{x=0}^X A^*_{mn} T \quad (7),$$

where X, Y are corners of the triangle in the coordinate system, T corresponds to the EM contribution of the triangle primitive to the display element, and $\varphi_{pq}$ is the partial contribution for non-zero term $B_{pq}$ in the DCT. The number of (p,q) DCT terms can be selected by considering both the information loss in reconstruction and the information compression.

Exemplary Process

Figure 4:
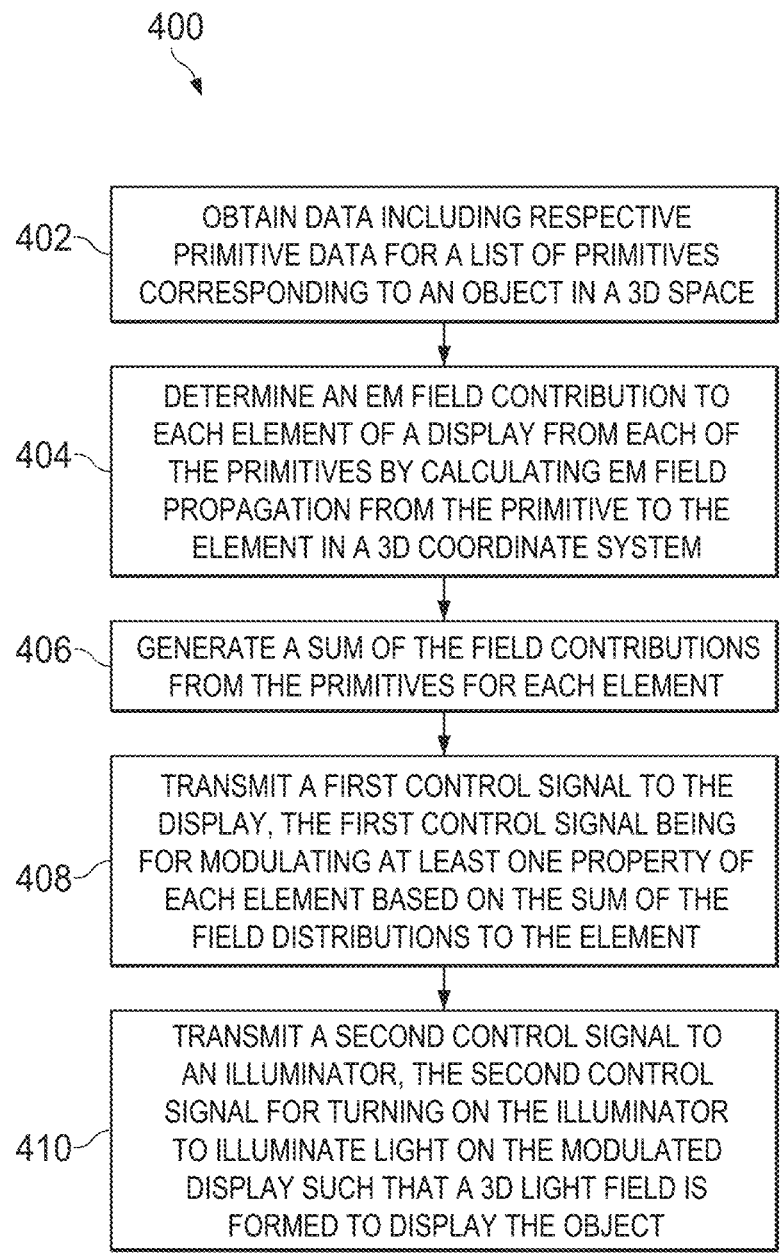
FIG. 4 is a flowchart of an example process of displaying an object in 3D.

FIG. 4 is a flowchart of an exemplary process 400 of displaying an object in 3D. The process 400 can be performed by a controller for a display. The controller can be the controller 112 of FIG. 1A or 152 of FIG. 1B. The display can the display 114 of FIG. 1A or 156 of FIG. 1B.

Data including respective primitive data for primitives corresponding to an object in a 3D space is obtained (402). The data can be obtained from a computing device, e.g., the computing device 102 of FIG. 1A. The computing device can process a scene to generate the primitives corresponding to the object. The computing device can include a renderer to generate the primitive data for the primitives. In some implementations, the controller generates the data itself, e.g., by rendering the scene.

The primitives can include at least one of a point primitive, a line primitive, or a polygon primitive. The list of primitives is indexed in a particular order, e.g., by which the object can be reconstructed. The primitive data can include color information that has at least one of a textured color or a gradient color. For example, the line primitive can have at least one of a gradient color or as a textured color. The polygon primitive can also have at least one of a gradient color or a textured color. The primitive data can also include texture information of the primitive and/or shading information on one or more surfaces of the primitive (e.g., a triangle). The shading information can include a modulation on at least one of color or brightness on the one or more surfaces of the primitive. The primitive data can also include respective coordinate information of the primitive in the 3D coordinate system.

The display can include a number of display elements, and the controller can include a number of computing units. Respective coordinate information of each of the display elements in the 3D coordinate system can be determined based on the respective coordinate information of the list of primitives in the 3D coordinate system. For example, a distance between the display and the object corresponding to the primitives can be predetermined. Based on the predetermined distance and the coordinate information of the primitives, the coordinate information of the display elements can be determined. The respective coordinate information of each of the display elements can correspond to a logical memory address for the element stored in a memory. In such a way, when the controller loops in a logical memory address for a display element in a logical memory space of the controller, a corresponding actual physical location for the display element in the space can be identified.

An EM field contribution from each of the primitives to each of the display elements is determined by calculating EM field propagation from the primitive to the element in the 3D coordinate system (404). The EM field contribution can include at least one of a phase contribution or an amplitude contribution.

As illustrated above with respect to FIGS. 3A-3C, at least one distance between the primitive and the display element can be determined based on the respective coordinate information of the display element and the respective coordinate information of the primitive. In some cases, for each primitive, the at least one distance can be calculated or computed just once. For example, the controller can determine a first distance between a first primitive of the primitives and a first element of the display elements based on the respective coordinate information of the first primitive and the respective coordinate information of the first element and determining a second distance between the first primitive and a second element of the elements based on the first distance and a distance between the first element and the second element. The distance between the first element and the second element can be predetermined based on a pitch of the plurality of elements of the display.

The controller can determine the EM field contribution to the display element from the primitive based on a predetermined expression for the primitive and the at least one distance. In some cases, as illustrated above with respect to FIGS. 3A-3C, the predetermined expression can be determined by analytically calculating the EM field propagation from the primitive to the element. In some cases, the predetermined expression is determined by solving Maxwell's equations. Particularly, the Maxwell's equations can be solved by providing a boundary condition defined at a surface of the display. The boundary condition can include a Dirichlet boundary condition or a Cauchy boundary condition. The primitives and the display elements are in the 3D space, and the surface of the display forms a portion of a boundary surface of the 3D space. The predetermined expression can include at least one of functions that include a sine function, a cosine function, and an exponential function. During computation, the controller can identify a value of the at least one of the functions in a table stored in a memory, which can improve a computation speed. The controller can determine the EM field contribution to each of the display elements for each of the primitives by determining a first EM field contribution from a first primitive to a display element in parallel with determining a second EM field contribution from a second primitive to the display element.

For each of the display elements, a sum of the EM field contributions from the list of primitives to the display element is generated (406).

In some implementations, the controller determines first EM field contributions from the primitives to a first display element and sums the first EM field contributions for the first element and determining second EM field contributions from the primitives to a second display element and sums the second EM field contributions for the second display element. The controller can include a number of computing units. The controller can determine an EM field contribution from a first primitive to the first element by a first computing unit in parallel with determining an EM field contribution from a second primitive to the first element by a second computing unit.

In some implementations, the controller determines first respective EM field contributions from a first primitive to each of the display elements and determine second respective EM field contributions from a second primitive to each of the display elements. Then the controller accumulates the EM field contributions for the display element by adding the second respective EM field contribution to the first respective EM field contribution for the display element. Particularly, the controller can determine the first respective EM field contributions from the first primitive to each of the display elements by using a first computing unit in parallel with determining the second respective EM field contributions from the second primitive to each of the display elements by using a second computing unit.

A first control signal is transmitted to the display, the first control signal being for modulating at least one property of each display element based on the sum of the field distributions to the display element (408). The at least one property of the element includes at least one of a refractive index, an amplitude index, a birefringence, or a retardance.

The controller can generate, for each of the display elements, a respective control signal based on the sum of the EM field contributions from the primitives to the element. The respective control signal is for modulating the at least one property of the element based on the sum of the EM field contributions from the primitives to the element. That is, the first control signal includes the respective control signals for the display elements.

In some examples, the display is controlled by electrical signals. Then the respective control signal can be an electrical signal. For example, an LCOS display includes an array of tiny electrodes whose voltage is individually controlled as element intensities. The LCOS display can be filled with a birefringent liquid crystal (LC) formulation that changes its refractive index. Thus, the respective control signals from the controller can control the relative refractive index across the display elements accordingly the relative phase of light passing through the display.

As discussed above, the display surface forms a part of the boundary surface. The controller can multiple a scale factor to the sum of the field contributions for each of the elements to obtain a scaled sum of the field contributions, and generate the respective control signal based on the scaled sum of the field contributions for the element. In some cases, the controller can normalize the sum of the field contributions for each of the elements, e.g., among all the elements, and generate the respective control signal based on the normalized sum of the field contributions for the element.

A second control signal is transmitted to an illuminator, the second control signal for turning on the illuminator to illuminate light on the modulated display (410). The controller can generate and transmit the second control signal in response to determining a completion of obtaining the sum of the field contributions for each of the display elements. Due to time symmetry (or conservation of energy), the modulated elements of the display can cause the light to propagate in different directions to form a volumetric light field corresponding to the object in the 3D space. The volumetric light field can correspond to a solution of Maxwell's equations with a boundary condition defined by the modulated elements of the display.

In some implementations, the illuminator is coupled to the controller through a memory buffer configured to control amplitude or brightness of one or more light emitting elements in the illuminator. The memory buffer for the illuminator can have a smaller size than a memory buffer for the display. A number of the light emitting elements in the illuminator can be smaller than a number of the elements of the display. The controller can be configured to activate the one or more light emitting elements of the illuminator simultaneously.

In some examples, the illuminator includes two or more light emitting elements each configured to emit light with a different color. The controller can be configured to sequentially modulate the display with information associated with a first color during a first time period and modulate the display with information associated with a second color during a second, sequential time period, and to control the illuminator to sequentially turn on a first light emitting element to emit light with the first color during the first time period and a second light emitting element to emit light with the second color during the second time period. In such a way, a multi-color object can be displayed in the 3D space.

In some examples, the display has a resolution small enough to diffract light. The illuminator can emit a white light on the display which can diffract the white light into light with different colors to thereby display a multi-color object.

Exemplary Systems

FIGS. 5A-5F show implementations of example systems for 3D displays. Any one of systems can correspond to, for example, the system 100 of FIG. 1A.

Figure 5A:
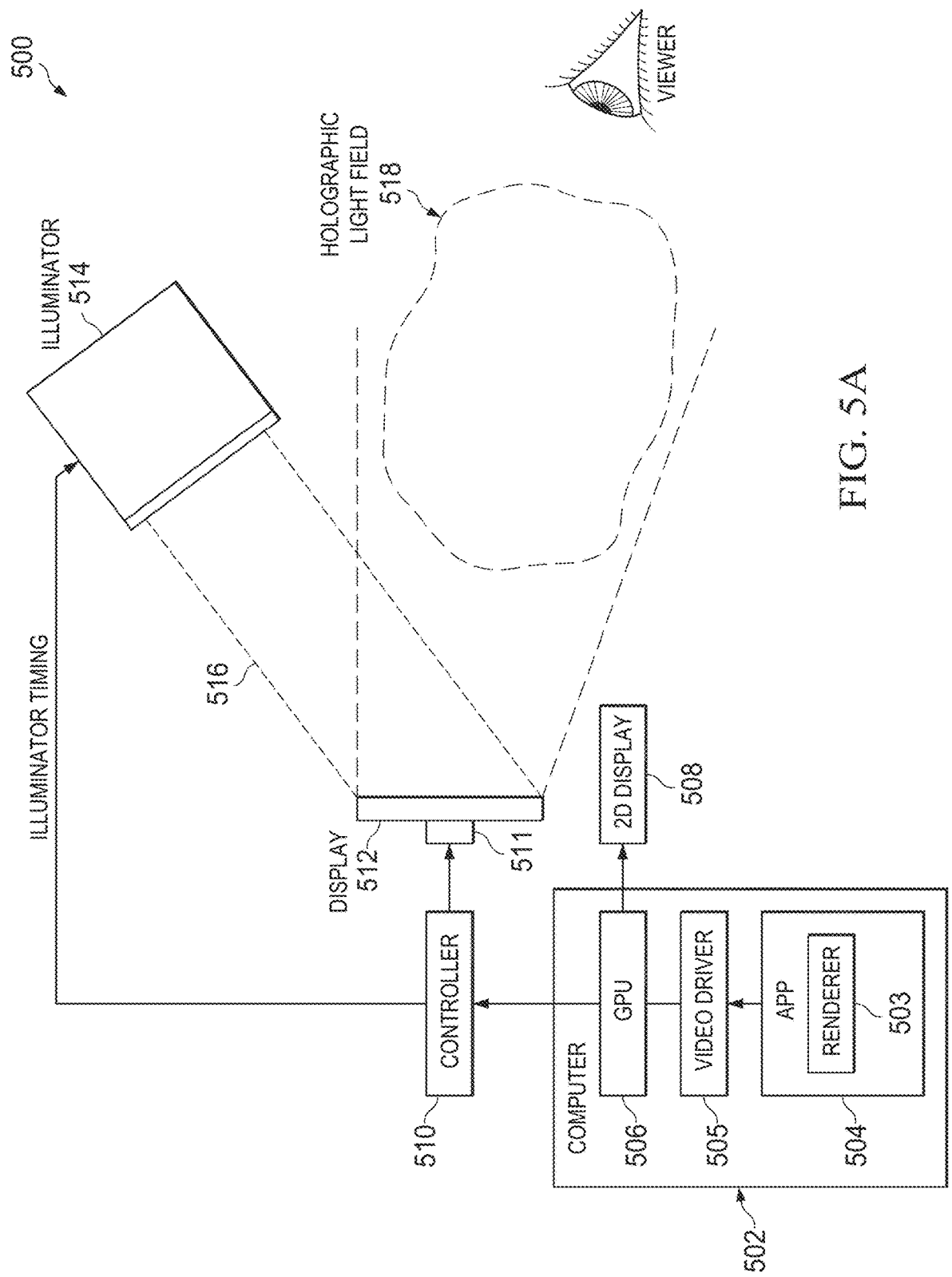

FIG. 5A illustrates a system 500 with a reflective display. The system 500 includes a computer 502, a controller 510 (e.g., ASIC), a display 512 (e.g., an LCOS device), and an illuminator 514. The computer 502 can be the computing device 102 of FIG. 1A, the controller 510 can be the controller 112 of FIG. 1A, the display 512 can be the display 114 of FIG. 1A, and the illuminator 514 can be the illuminator 116 of FIG. 1A.

As illustrated in FIG. 5A, the computer 502 includes an application 504 that has a renderer 503 for rendering a scene of an object. The rendered scene data is sequentially processed by a video driver 505 and a GPU 506. The GPU 506 can be the GPU 108 of FIG. 1A and configured to generate a list of primitives corresponding to the scene and respective primitive data. For example, the video driver 505 can be configured to process the rendered scene data and generate a list of primitives. As noted above, the GPU 506 can include a conventional 2D renderer, e.g., the conventional 2D renderer 120 of FIG. 1A, to render the primitives into a list of items to draw on a 2D display screen 508. The GPU 506 or the controller 510 can include a holographic renderer, e.g., the holographic renderer 130 of FIG. 1A, to render the list of primitives into graphic data to be displayed by the display 512.

The controller 510 is configured to receive the graphic data from the computer 502, compute EM field contributions from the list of primitives to each of elements of the display 512, and generate a respective sum of the EM field contributions from the primitives to each of the elements. The controller 510 can generate respective control signals to each of the display elements for modulating at least one property of the display element. The controller can transmit the respective control signals to the display elements of the display 512 through a memory buffer 511 for the display 512.

The controller 510 can also generate and transmit a control signal, e.g., an illumination timing signal, to activate the illuminator 514. For example, the controller 510 can generate and transmit the control signal in response to determining that the computations of the sums of EM field contributions from the primitives to the display elements are completed. As noted above, the controller 510 can transmit the control signal to the illuminator 514 via a memory buffer. The memory buffer can be configured to control amplitude or brightness of light emitting elements in the illuminator 514 and activate the light emitting elements simultaneously.

As illustrated in FIG. 5A, the illuminator 514 can emit a collimated light beam 516 that is incident on a front surface of the display 512 at an incident angle in a range between 0 degree and 90 degree. The emitted light beam is reflected from the front surface of the display 512 to form a holographic light field 518, corresponding to the object, which can be seen by a viewer.

Figure 5B:
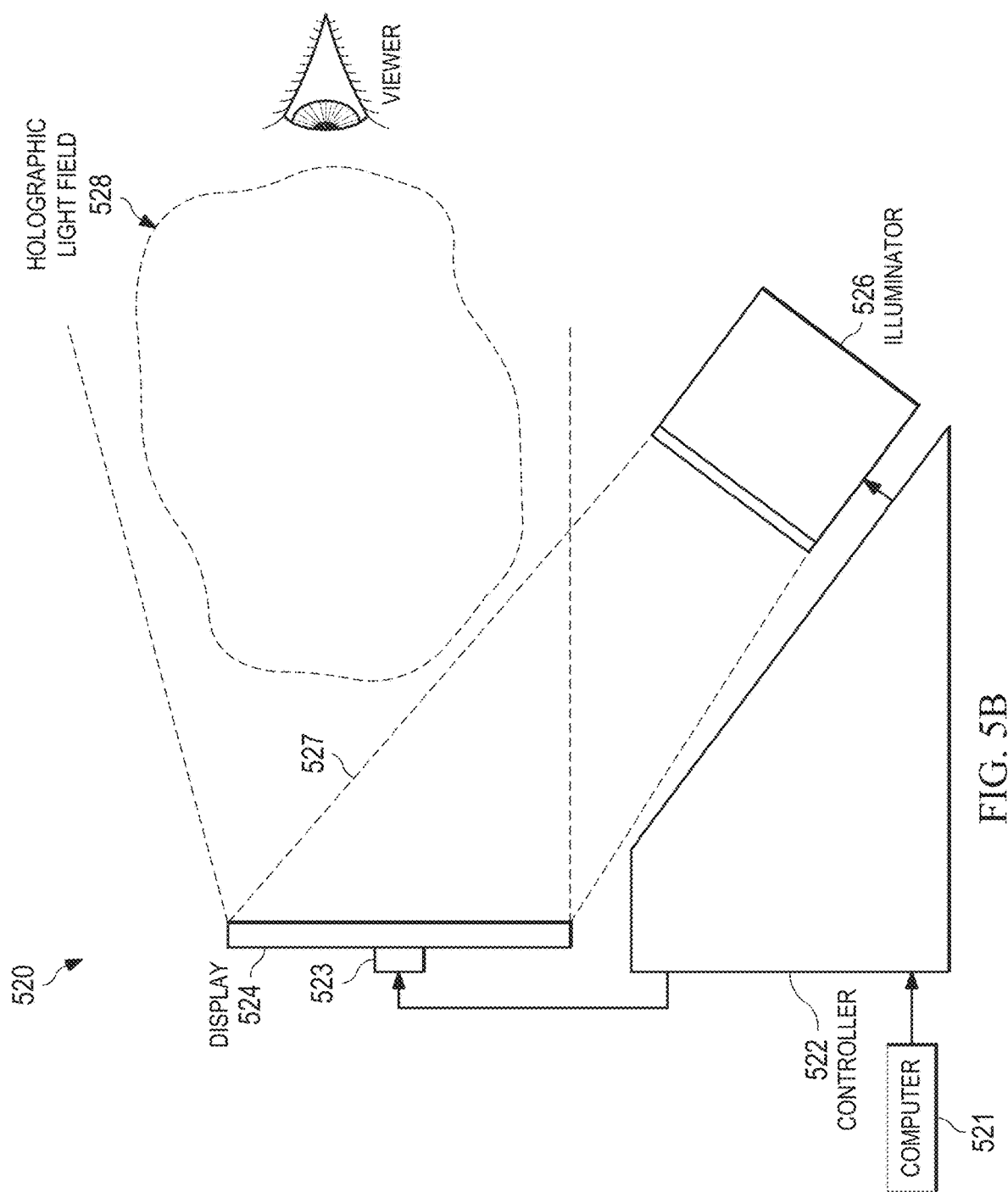

FIG. 5B illustrates another system 520 with another reflective display 524. Compared to the system 500 of FIG. 5A, the system 520 has a larger reflective display 524. To accommodate this, a display controller 522 is included in a wedge housing that can be a support for an illuminator 526. The controller 522 is similar to the controller 510 of FIG. 5A and can be configured to receive graphic data from a computer 521, compute EM field contributions from primitives to each of display elements of the display 524, and generate a respective sum of the EM field contributions from the primitives to each of the display elements. The controller 522 then generates respective control signals to each of the display elements for modulating at least one property of the display element and transmits the respective control signals to the display elements of the display 524 through a memory buffer 523 for the display 524.

The controller 522 also transmits a control signal to the illuminator 526 to activate the illuminator 526. The illuminator 526 emits a divergent or semi-collimated light beam 527 to cover a whole surface of the display 524. The light beam 524 is reflected by the modulated display 524 to form a holographic light field 528.

Figure 5C:
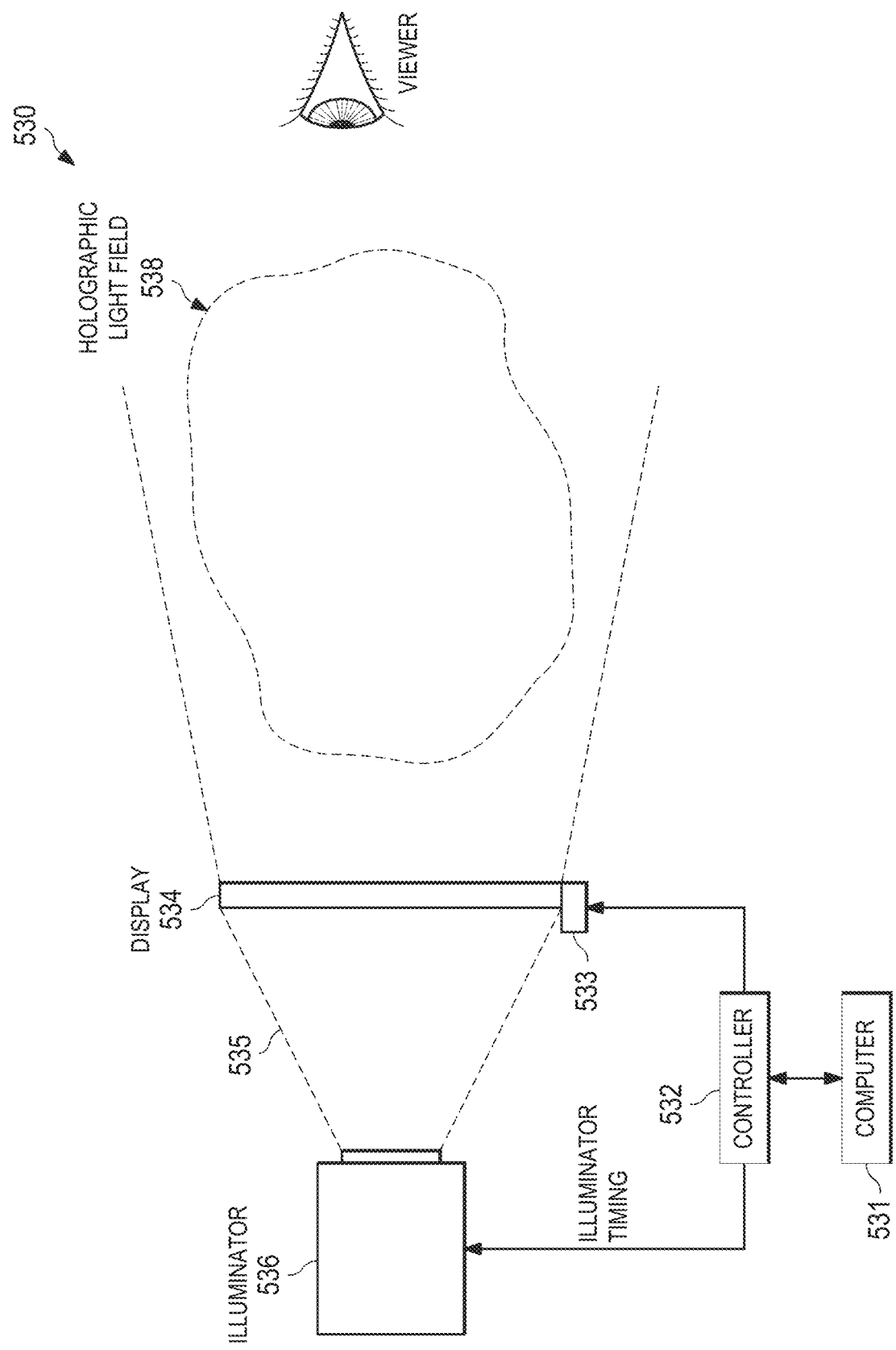

FIG. 5C illustrates a system 530 with a transmissive display 534. The transmissive display 534, for example, can be a large scale display. The system 530 includes a controller 532 which can be similar to the controller 510 of FIG. 5A. The controller 532 can be configured to receive graphic data from a computer 531, compute EM field contributions from primitives to each of display elements of the display 534, and generate a respective sum of the EM field contributions from the primitives to each of the display elements. The controller 532 then generates respective control signals to each of the display elements for modulating at least one property of the display element and transmits the respective control signals to the display elements of the display 534 through a memory buffer 533 for the display 534.

The controller 532 also transmits a control signal to an illuminator 536 to activate the illuminator 536. Different from the system 500 of FIG. 5A and the system 520 of FIG. 5B, the illuminator 536 in the system 530 is positioned behind a rear surface of the display 534. To cover a large surface of the display 534, the illuminator 536 emits a divergent or semi-collimated light beam 535 on the rear surface of the display 534. The light beam 524 is transmitted through the modulated display 534 to form a holographic light field 538.

Figure 5D:
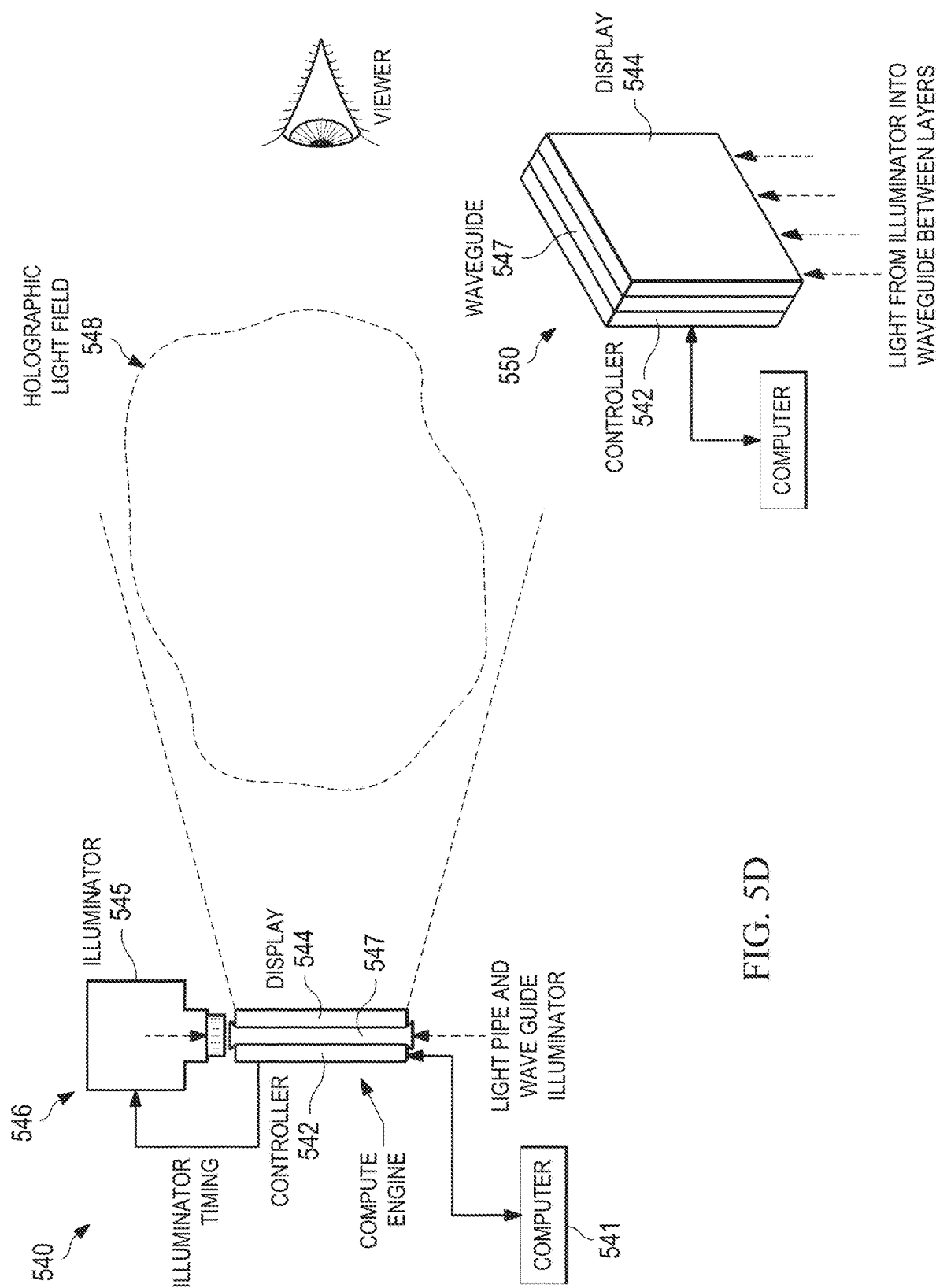

FIG. 5D illustrates another system 540 with a transmissive display 544. The system 540 also includes a controller 542 and an illuminator 546. The controller 542 can be similar to the controller 510 of FIG. 5A, and can be configured to receive graphic data from a computer 541, perform computation on the graphic data, generate and transmit control signals for modulation to the display 544 and a timing signal to activate the illuminator 546.

The illuminator 546 can include a light source 545 and a waveguide 547. Light emitted from the light source 545 can be coupled to the waveguide 547, e.g., from a side cross-section of the waveguide. The waveguide 547 is configured to guide the light to illuminate a surface of the display 544 uniformly. The light guided by the waveguide 547 is incident on a rear surface of the display 544 and transmitted through the display 544 to form a holographic light field 548.

Different from the system 500 of FIG. 5A, 520 of FIG. 5B, 530 of FIG. 5C, in the system 540, the controller 542, the display 544, and the waveguide 547 are integrated together into a single unit 550. In some cases, the waveguide 547 and the light source 545 can be integrated as an active waveguide illuminator in a planar form, which can further increase a degree of integration of the single unit 550. As discussed above, the single unit 500 can be connected with other similar units 550 to form a larger holographic display device.

FIG. 5E illustrates another system 560 with another transmissive display 564. Compared to the system 540, the transmissive display 564 can potentially implement a display that is larger than the transmissive display 544. For example, the transmissive display 564 can have a larger area than a controller 562, and to accommodate this, the controller 562 can be positioned away from the display 564. The system 560 includes an illuminator 566 that has a light source 565 and a waveguide 567. The waveguide 567 is integrated with the display 564, e.g., to a rear surface of the display 564. In some implementations, the display 564 is fabricated on a front side of a substrate and the waveguide 567 can be fabricated on a back side of the substrate.

The controller 562 can be similar to the controller 510 of FIG. 1A and configured to receive graphic data from a computer 561, perform computation on the graphic data, generate and transmit control signals for modulation to the display 564 through a memory buffer 563 and a timing signal to activate the light source 565. Light emitted from the light source 565 is guided in the waveguide 567 to illuminate on the rear surface of the display 564 and transmitted through the display 564 to form a holographic light field 568.

Figure 5F:
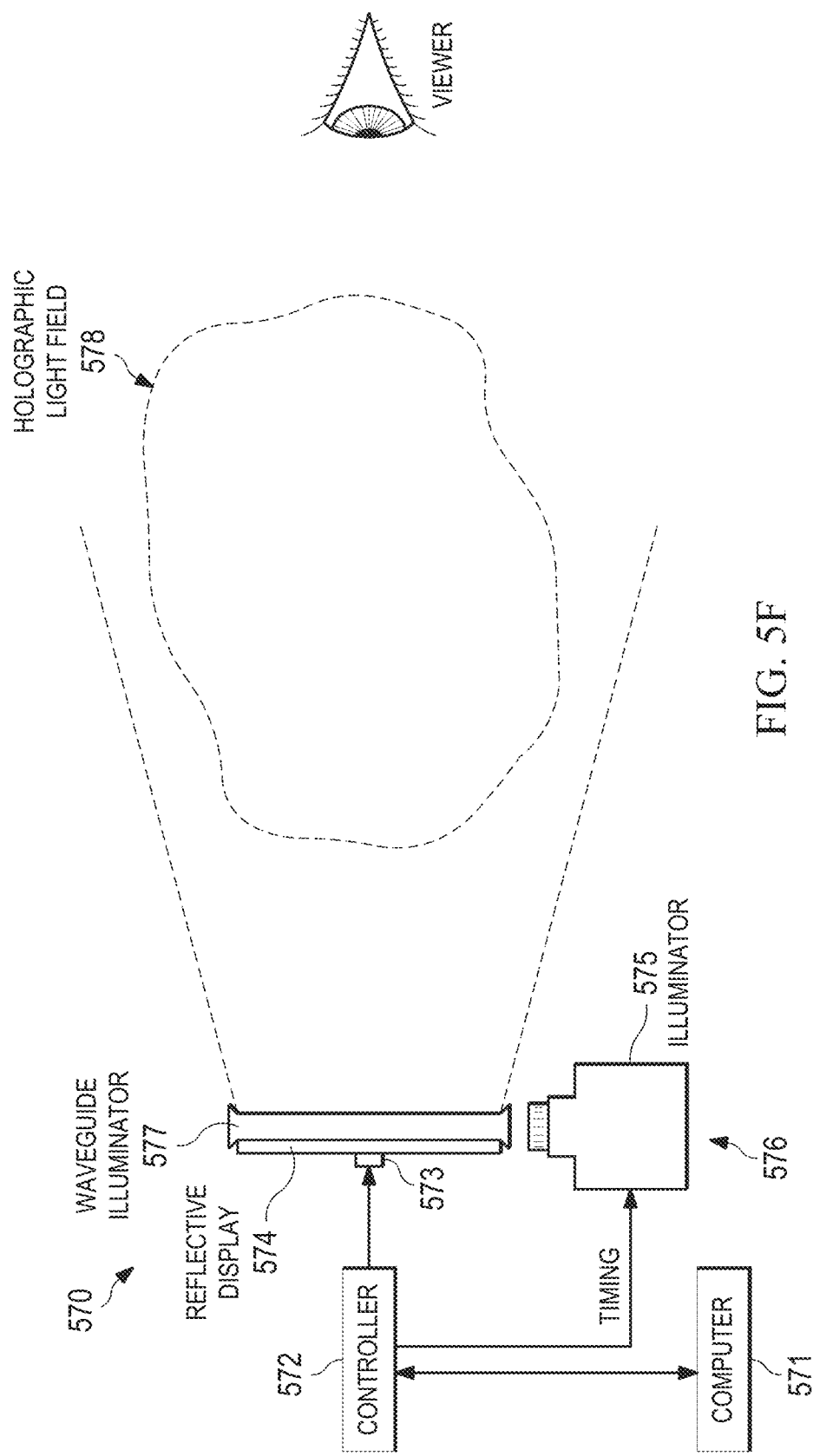

FIG. 5F illustrates another system 570 with a reflective display 574. The reflective display 574, for example, can be a large display. A waveguide 577 of an illuminator 576 is positioned on a front surface of the reflective display 574. A controller 572, similar to the controller 562 of FIG. 5E, can be configured to receive graphic data from a computer 571, perform computation on the graphic data, generate and transmit control signals for modulation to the display 574 through a memory buffer 573 and a timing signal to activate a light source 575 of the illuminator 576. Light coupled from a light source 575 of the illuminator 576 is guided to be incident on the front surface of the display 574 and reflected by the front surface to form a holographic light field 578.

Exemplary Display Implementations

As noted above, a display in Maxwell holography can be a phase modulating device. A phase element of the display (or a display element) can be represented as a phasel. For illustration only, a liquid crystal on silicon (LCOS) device is discussed below to function as the phase modulating device. The LCOS device is a display using a liquid crystal (LC)

layer on top of a silicon backplane. The LCOS device can be optimized to achieve minimum possible phasel pitch, minimum cross-talk between phasels, and/or a large available phase modulation or retardance (e.g., at least $2\pi$).

A list of parameters can be controlled to optimize the performance of the LCOS device, including a birefringence of LC mixture ($\Delta n$), a cell gap (d), dielectric anisotropy of LC mixture ($\Delta \varepsilon$), rotational viscosity of the LC mixture ($\eta$), maximum applied voltage between the silicon backplane and a common electrode on top of the LC layer (V).

There can be a fundamental trade-off that exists between parameters of the liquid crystal material. For example, a fundamental bounding parameter is the available phase modulation or retardance (Re), which can be expressed as:

$$Re = 4\pi \cdot \Delta n \cdot d / \lambda \tag{8}$$

where $\lambda$ is the wavelength of an input light. If the retardance Re needs to be at least $2\pi$ for a red light with a wavelength of about 0.633 µm, then $$\Delta n \cdot d \geq 0.317 \text{ µm} \tag{9}$$

The above expression implies that there is a direct trade-off between cell gap (d) and birefringence ($\Delta n$) of the LC mixture.

Another bounding parameter is the switching speed, or the switching time (T) it takes for the liquid crystal (LC) molecules in an LC layer to reach the desired orientation after a voltage is applied. For example, for real-time video (~60 Hz) using 3-color field sequential color system, a minimum of 180 Hz modulation of the LC layer is involved, which puts an upper bound on the LC switching speed of 5.6 milliseconds (ms). Switching time (T) is related to a number of parameters including the liquid crystal, cell gap, and applied voltage. First, T is proportional to $d^2$. As the cell gap d is decreased, the switching time decreases as the square. Second, the switching time is also related to the dielectric anisotropy ($\Delta \varepsilon$) of the liquid crystal (LC) mixture, with a higher dielectric anisotropy resulting in a shorter switching time and a lower viscosity also resulting in a shorter switching time.

A third bounding parameter can be the fringing field. Due to the high electron mobility of crystalline silicon, an LCOS device can be fabricated with a very small phasel size (e.g., less than 10 µm) and submicron inter-phasel gap. When the adjacent phasels are operated at different voltages, the LC directors near the phasel edges are distorted by the lateral component of the fringing field, which significantly degrades the electro-optic performance of the device. In addition, as the phasel gap becomes comparable to the incident light wavelength, diffraction effect can cause severe light loss. The phasel gap needs to be kept at less than or equal to a phasel pitch to keep noise within an acceptable level.

In some examples, the LCOS device is designed to have a phasel pitch of 2 µm and a cell gap of approximately 2 µm as well if the fringe field bounding condition is observed. According to the above expression $\Delta n \cdot d \geq 0.317$ µm, $\Delta n$ needs to be equal to 0.1585 or greater, which is achievable using current liquid crystal technology. Once the minimum birefringence for a given phasel pitch is determined, the LC can be optimized for switching speed, e.g., by increasing the dielectric anisotropy and/or decreasing the rotational viscosity.

Nonuniform Phasels Implementations for Displays

In an LCOS device, a circuit chip, e.g., a complementary metal-oxide-semiconductor (CMOS) chip or equivalent, controls the voltage on reflective metal electrodes buried below the chip surface, each controlling one phasel. A common electrode for all the phasels is supplied by a transparent conductive layer made of indium tin oxide on the cover glass. The phasels can have identical sizes and same shape (e.g., square). For example, a chip can have 1024×768 plates, each with an independently addressable voltage. As noted above, when the phasel gap becomes comparable to the incident light wavelength, diffraction effect can appear in the periodic structure of the LCOS device, which may cause severe light loss.

Figure 6A:
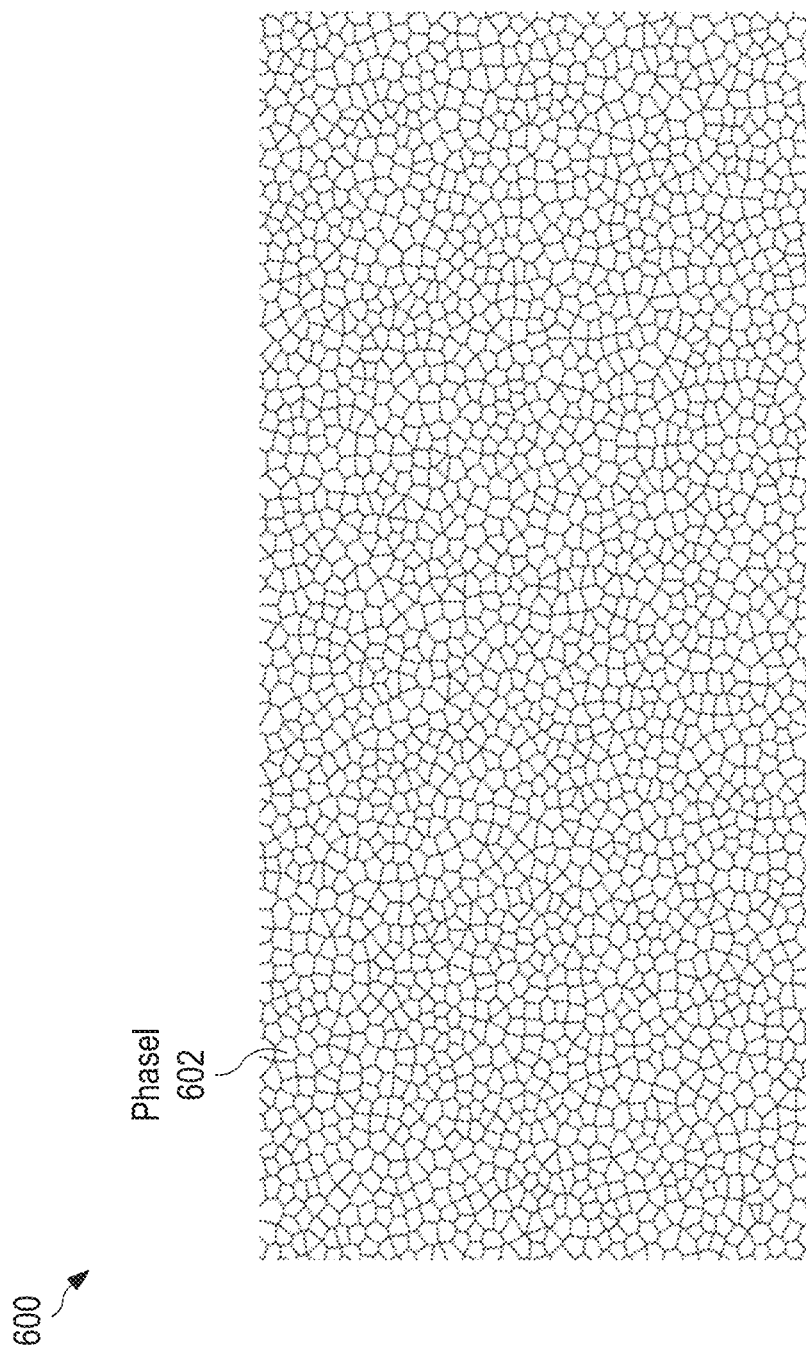
FIG. 6A illustrates an example display with display elements having nonuniform shapes.

In Maxwell holographic calculations, each phasel receives a sum of EM contributions from each primitive and is relatively independent from each other. Thus, the phasels of the LCOS device in Maxwell holography can be designed to be different from each other. For example, as illustrated in FIG. 6A, the LCOS device 600 can be made of a number of nonuniform (or irregular) phasels 602. At least two phasels 602 have different shapes. The nonuniform shapes of the phasels 602 can greatly reduce or eliminate diffractive aberrations, among other effects and thus improve image quality. Although the phasels can have nonuniform shapes, the phasels can be designed to have a size distribution (e.g., about 3 µm) that satisfies a desired spatial resolution. The silicon backplane can be configured to provide a respective circuit (e.g., including a metal electrode) for each of the phasels according to the shape of the phasel.

In an array of phasels in an LCOS device, to select a specific phasel, a first voltage is applied to a word line connecting a row of phasels including the specific phasel and a second voltage is applied to a bit line connecting a column of phasels including the specific phasel. As each phasel has a resistance, the operational speed of the LCOS device can be limited.

Figure 6B:
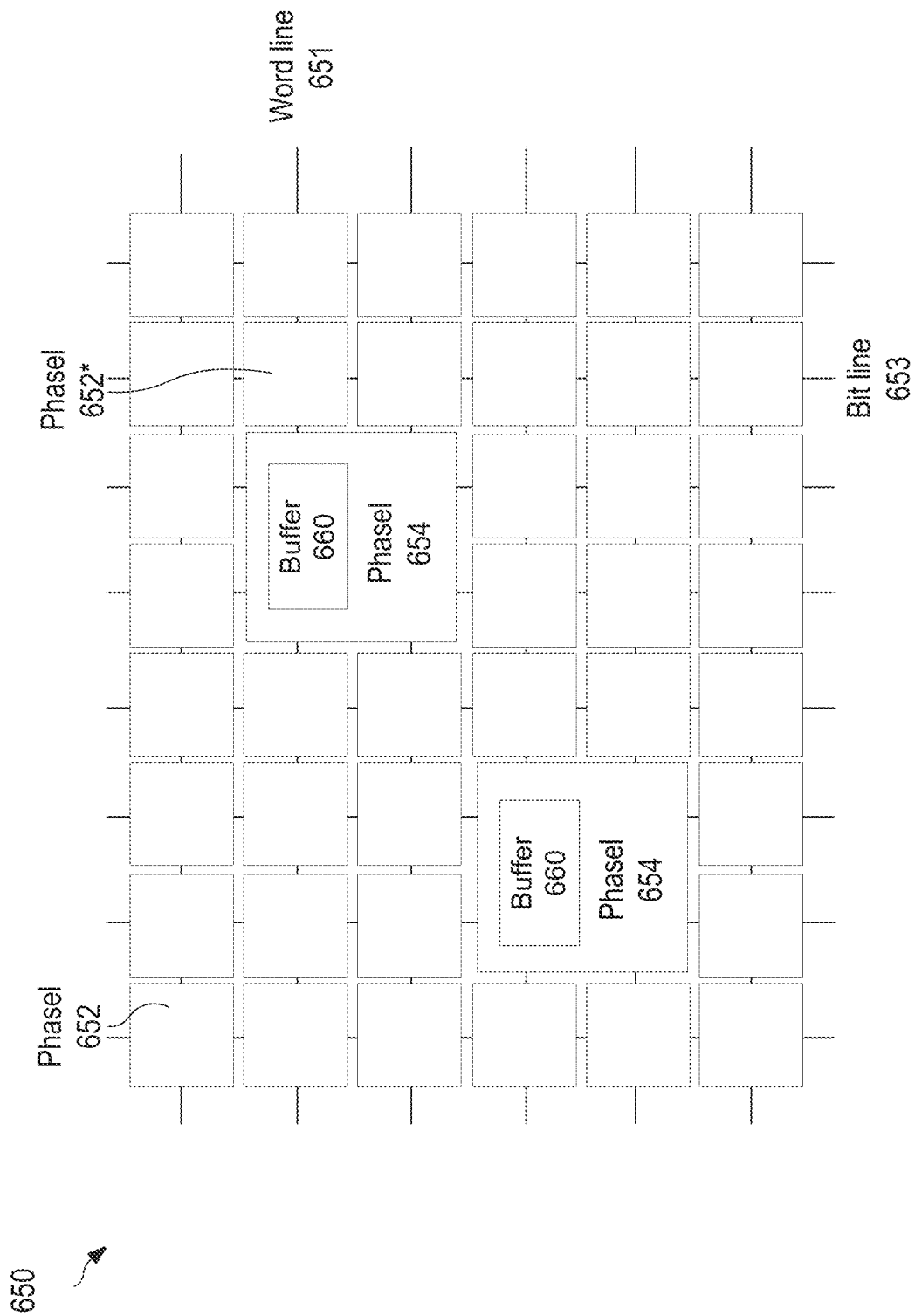
FIG. 6B illustrates an example display with display elements having different sizes.

As noted above, in Maxwell holography, the phasels can have different sizes. As illustrated in FIG. 6B, an LCOS device 650 is designed to have one or more phasels 654 having a size larger than the other phasels 652. All of the phasels can still have a size distribution that satisfies the desired resolution. For example, 99% of the phasels have a size of 3 µm, and only 1% of the phasels have a size of 6 µm. The larger size of the phasel 654 allows to arrange at least one buffer 660 in the phasel 654 besides other circuitry same as in the phasel 652. The buffer 660 is configured to buffer the applied voltage such that the voltage is only applied to a smaller number of phasels within a row or column of phasels. The buffer 660 can be an analog circuit, e.g., made of a transistor, or a digital circuit, e.g., made of a number of logic gates, or any combination thereof.

For example, as illustrated in FIG. 6B, a voltage is applied to a word line 651 and another voltage is applied to a bit line 653 to select a particular phasel 652*. The phasel 652* is in the same row as the larger phasel 654 including the buffer 660. The voltage is mainly applied to the first number of phasels in the row and before the larger phasel 654 and obstructed by the buffer 660 in the larger phasel 654. In such a way, the operational speed of the LCOS device 650 can be improved. With the larger size of the phasels 654, other circuitry can be also arranged in the LCOS device 650 to further improve the performance of the LCOS device 650. Although the phasels 654 and the phasels 652 in FIG. 6B have square shape, the phasels can also have different shapes as illustrated in FIG. 6A as long as there are one or more phasels 654 having a larger size than the other phasels 652.

Exemplary Calibrations

The unique nature of Maxwell holography in the present disclosure allows for the protection of calibration techniques that can create a significant competitive advantage in the actual production of high quality displays. A number of calibration techniques can be implemented to be combined with the Maxwell holographic computational techniques, including:

(i) using image sensors in conjunction with a Dirichlet boundary condition modulator and/or in conjunction with mechanical and software diffractive and non-diffractive calibration techniques;

(ii) software alignments and software calibrations including individual color calibrations and alignments with Dirichlet boundary condition modulators; and (iii) embedding silicon features in the boundary condition modulators that allow for a photo detection to be built directly into the modulator that when combined with Maxwell holography create a powerful and unique approach to simplifying manufacturing calibration processes.

In the following, for illustration only, three types of calibrations are implemented for phase based displays, e.g., LCOS displays. Each phase element can be represented as a phasel.

Phase Calibration

An amount of phase added to light impinging upon an LCOS phase element (or phasel) can be known directly by a voltage applied to the LCOS phasel. This is due to the birefringent liquid crystal (LC) rotating in the presence of an electric field and thus changing its index of refraction and slowing down light to alter its phase. The altered phase can depend upon electrical characteristics of the liquid crystal (LC) and the silicon device in which the LC resides. Digital signals sent to the LCOS need to be transformed into correct analog voltages to achieve high quality holographic images. Phase calibration is involved for the LCOS device to ensure that a digital signal is properly transformed into an analog signal applied to the LC such that it produces the greatest amount of phase range. This conversion is expected to result in a linear behavior. That is, as the voltage is changed by fixed increments, the phase also changes by a fixed increment, regardless of the starting voltage value.

In some cases, an LCOS device allows a user to alter a digital-to-analog converter (DAC) such that the user has a control over the amount of analog voltage output given a digital input signal. A digital potentiometer can be applied to each input bit. For example, if there are 8 input bits, there can be 8 digital potentiometers corresponding to each input bit. The same digital inputs from the digital potentiometers can be applied to all phasels of the LCOS device. Bits set to "1" activate a voltage, and bits set to "0" do not activate the voltage. All voltages from such "1" bits are summed together to obtain the final voltage sent to each phasel. There may also be a DC voltage applied in all cases such that all "0" bits results in a baseline non-zero voltage. Thus, the phase calibration of the LCOS device can be implemented by setting values of the digital potentiometers for the LCOS device. For example, as noted above, a controller can compute EM field contributions from a list of primitives to each of phasels of a display, generate a respective sum of the EM field contributions from the primitives to each of the phasels, and generate respective control signals to each of the phasels for modulating a phase of the phasel. The same digital inputs from the digital potentiometers can be applied to adjust the respective control signals to all of the phasels of the LCOS device, which is difference from a phasel-by-phasel based phase calibration. The digital inputs can be set once for a duration of an operation of the LCOS device, e.g., for displaying a hologram.

To determine an optimal set of phase calibration values for the digital inputs, a genetic algorithm can be applied, where there are many input values that lead to one output value, such as phase range or holographic image contrast. This output value can be reduced to one number known as the fitness. The genetic algorithm can be configured to explore different combinations of input values until it achieves an output with the highest fitness. In some cases, the algorithm can take two or more of the most fit inputs and combine a number of their constituent values together to create a new input that has characteristics of the taken inputs but is different from each of the taken inputs. In some cases, the algorithm can alter one of these constituent values to something not from either of the taken fit inputs, which is represented as a "mutation" and can add a variety to the available fit inputs. In some cases, one or more optimal values can be found by taking advantage of the knowledge gained from prior measurements with good results while trying new values so the optimal values do not be restricted to a local maximum.

There can be multiple ways to calculate the fitness output value. One way is to calculate the phase change of the light given a set of digital inputs applied to all the phasels on the LCOS. In this scheme, the incident light can be polarized. Upon impinging upon the LCOS, the incident light's polarization can change depending on the rotation of the LC. The incident light can be reflected back through another polarizer set to either the same polarization or 90 degrees different from the original polarization and then into a light detector. Therefore, when the LC rotation changes, the intensity as viewed from the light detector can change. Accordingly, the phase change of the light can be perceived indirectly through the intensity variations. Another way to calculate the phase change is to measure the intensity difference of a Maxwell holographic reconstruction from the background. This is most effective in a projective display. Measuring the intensity in such an instance may need the use of computer vision algorithms to identify the Maxwell holographic reconstruction and measure its intensity.

Alignment Calibration

Light sources are not guaranteed to be aligned within a holographic device and therefore need to be aligned. Different liquid crystals (LC) can also behave differently given the wavelengths of the light sources. Moreover, both the LC and light sources can change device to device, giving different characteristics, e.g., object scaling, to the same input hologram when shown in a different base color. Furthermore, certain hardware features can apply different optical effects to the output light, e.g., lensing, that also need correction.

In some implementations, the problems described above can be addressed by applying a mathematical transform to a phase calculated for a phasel of a display. The phase is a respective sum of the EM field contributions from a list of primitives to the phasel. The mathematical transform can be derived from a mathematical expression, e.g., a Zernike polynomial, and can be varied by altering polynomial coefficients or other varying input values. The mathematical transform can vary phasel-by-phasel as well as by color. For example, there is a Zernike polynomial coefficient that corresponds to the amount of tilt to be applied to the light after it reflects off of the display.

To determine these coefficients/input values, a hardware setup can be created where a camera is pointed at a reflective surface in the case of a projective display and directly into the LCOS in the case of a direct-view display. A series of holographic test patterns and objects can be sent to the display and are viewed by the camera. The camera can use machine vision algorithms to determine what is being displayed and then calculate its fitness. For example, if a grid of dots is the test pattern, then the fitness is how close they are together, how centered they are positioned, how much distortion they have (e.g., scale or pincushion), etc. There can be different fitness values for different characteristics. Depending on these values, corrections can be applied, e.g., in the form of changing coefficients to the Zernike polynomial, until the fitness reaches a predetermined satisfactory level. These test patterns can be rendered at different distances to ensure that alignment is consistent for objects at all the distances, and not just one point in particular. Such depth-based calibrations involve iterative processes that involve altering the depth of the holographic test pattern as well as the reflective surface in the case of a projective display where the previous calibrations may be repeated until converging upon a solution that works at both depths. Finally, white dots can be displayed to show the effectiveness of the calibration.

Color Calibration

In displays, holographic or otherwise, it is important that, when any two units are rendering the same image, colors match between displays and additionally match colors defined by television (TV) and computer display standards, like the Rec.709 standard for high-definition television (HDTV) or the sRGB color space of computer monitors. Different batches of hardware components, e.g., LEDs and laser diodes, can exhibit different behaviors for the same inputs and can output different colors when perceived by the human eye. Therefore, it is important to have a color standard to which all display units can be calibrated.

In some implementations, an objective measurement of color specified by measurements of intensity and chromaticity can be obtained by measuring color intensity against a Commission internationale de l'éclairage (CIE) Standard Observer curves. By requesting that each display reproduces a sample set of known colors and intensities, then measuring the output light using a Colorimeter device calibrated to the CIE Standard Observer curves, the color output of a device in CIE XYZ color space can be objectively defined. Any deviation of the measured values from the known good values can be used to adapt the output colors on the display to bring it back into alignment, which can be implemented using an iterative measure-adapt-measure feedback loop. Once a Maxwell holographic device produces accurate outputs for a given set of inputs, the final adaptations can be encoded as look-up tables for the illuminators that map input values to output intensities, and color matrix transformations that transform input colors to output color space values. These calibration tables can be embedded in the device itself to produce reliable objective output colors.

Additionally, given an LCOS device with fine enough features to control diffraction with sub-wavelength accuracy, there may be no need for tri-stimulus illumination (e.g., linear mixes of red, green, and blue), and the LCOS device can be illuminated with a single wide spectrum light source and selectively tune the phasels output to produce tri-, quad-, even N-stimulus output colors which, combined with spatial dithering patterns, can reproduce a complete spectral output of a color rather than the common tri-stimulus approximation. Given a sufficiently wide spectrum illuminator this allows Maxwell holography to produce any reflected color that lies inside the spectral locus of human visual system.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Implementations of the subject matter described in this specification can be implemented as one or more computer programs, such as, one or more modules of computer program instructions encoded on a tangible, non-transitory computer-storage medium for execution by, or to control the operation of, data processing apparatus. Alternatively or in addition, the program instructions can be encoded on an artificially generated propagated signal, such as, a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of one or more of them.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be or further include special purpose logic circuitry, for example, a central processing unit (CPU), an FPGA (field programmable gate array), or an ASIC (application-specific integrated circuit). In some implementations, the data processing apparatus and special purpose logic circuitry may be hardware-based and software-based. The apparatus can optionally include code that creates an execution environment for computer programs, for example, code that constitutes processor firmware, a protocol stack, a database management system, an operating system, or a combination of one or more of them. The present specification contemplates the use of data processing apparatuses with or without conventional operating systems.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, libraries, and such, as appropriate. Conversely, the features and functionality of various components can be combined into single components as appropriate.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, such as, a CPU, a GPU, an FPGA, or an ASIC.

Computers suitable for the execution of a computer program can be based on general or special purpose microprocessors, both, or any other kind of CPU. Generally, a CPU will receive instructions and data from a read-only memory (ROM) or a random access memory (RAM) or both. The main elements of a computer are a CPU for performing or executing instructions and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable storage device, for example, a universal serial bus (USB) flash drive, to name just a few.

Computer readable media (transitory or non-transitory, as appropriate) suitable for storing computer program instructions and data include all forms of non-volatile memory, media and memory devices, including by way of example semiconductor memory devices, for example, erasable programmable read-only memory (EPROM), electrically erasable programmable read-only memory (EEPROM), and flash memory devices; magnetic disks, for example, internal hard disks or removable disks; magneto-optical disks; and CD-ROM, DVD-R, DVD-RAM, and DVD-ROM disks. The memory may store various objects or data, including caches, classes, frameworks, applications, backup data, jobs, web pages, web page templates, database tables, repositories storing business and dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, for example, a cathode ray tube (CRT), liquid crystal display (LCD), light emitting diode (LED), or plasma monitor, for displaying information to the user and a keyboard and a pointing device, for example, a mouse, trackball, or trackpad by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or "GUI," may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include multiple user interface (UI) elements, some or all associated with a web browser, such as interactive fields, pull-down lists, and buttons operable by the business suite user. These and other UI elements may be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a web browser through which a user can interact with an implementation of the subject matter described in this specification, or any combination of one or more such back-end, middleware, or front-end components. The components of the system can be interconnected by any form or medium of wireline or wireless digital data communication, for example, a communication network. Examples of communication networks include a local area network (LAN), a radio access network (RAN), a metropolitan area network (MAN), a wide area network (WAN), worldwide interoperability for microwave access (WIMAX), a wireless local area network (WLAN) using, for example, 902.11 a/b/g/n and 902.20, all or a portion of the Internet, and any other communication system or systems at one or more locations. The network may communicate with, for example, internet protocol (IP) packets, frame relay frames, asynchronous transfer mode (ATM) cells, voice, video, data, or other suitable information between network addresses.

The computing system can include clients and servers. A client and server are generally remote from each other and typically interact through a communication network. The relationship of client and server arises by virtue of computer programs running on the respective computers and having a client-server relationship to each other.

In some implementations, any or all of the components of the computing system, both hardware and software, may interface with each other or the interface using an application programming interface (API) or a service layer. The API may include specifications for routines, data structures, and object classes. The API may be either computer language-independent or-dependent and refer to a complete interface, a single function, or even a set of APIs. The service layer provides software services to the computing system. The functionality of the various components of the computing system may be accessible for all service consumers via this service layer. Software services provide reusable, defined business functionalities through a defined interface. For example, the interface may be software written in any suitable language providing data in any suitable format. The API and service layer may be an integral or a stand-alone component in relation to other components of the computing system. Moreover, any or all parts of the service layer may be implemented as child or sub-modules of another software module, enterprise application, or hardware module without departing from the scope of this specification.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described as acting in certain combinations and even initially claimed as such, one or more features from a claimed combination can in some cases be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing may be advantageous and performed as deemed appropriate.

Accordingly, the earlier provided description of example implementations does not define or constrain this specification. Other changes, substitutions, and alterations are also possible without departing from the spirit and scope of this specification.

What is claimed is:

1. A method comprising:
   for each primitive of a plurality of primitives corresponding to an object, determining an electromagnetic (EM) field contribution to each display element of a plurality of display elements of a display by computing, in a three-dimensional (3D) coordinate system, EM field propagation from the primitive to the display element; and
   for each display element of the plurality of display elements,
      generating a sum of the EM field contributions from the plurality of primitives to the display element,
      multiplying a scale factor to the sum of the EM field contributions for the display element to obtain a scaled sum of the EM field contributions, and
      generating a respective control signal based on the scaled sum of the EM field contributions of the plurality of primitives to the display element,
      wherein the respective control signal is configured to modulate at least one property of the display element based on the scaled sum of the EM field contributions from the plurality of primitives to the display element.

2. The method of claim 1, wherein the plurality of primitives comprise at least one member selected from the group consisting of a point primitive, a line primitive, and a polygon primitive.

3. The method of claim 1, further comprising obtaining respective primitive data for each primitive of the plurality of primitives,
   wherein the respective primitive data for the primitive comprises at least one member selected from the group consisting of:
      texture information of the primitive;
      shading information on one or more surfaces of the primitive;
      color information of the primitive; and
      coordinate information of the primitive in the 3D coordinate system.

4. The method of claim 1, wherein determining the EM field contribution of the primitive to each display element of the plurality of display elements of the display comprises:
   determining, in the 3D coordinate system, at least one distance between the display element and the primitive based on corresponding coordinate information of the display element and corresponding coordinate information of the primitive, and
   determining the EM field contribution of the primitive to the display element based on a predetermined expression for the primitive and the at least one distance.

5. The method of claim 4, wherein the predetermined expression is determined by analytically calculating the EM field propagation from the primitive to the display element.

6. The method of claim 4, wherein the predetermined expression corresponds to a solution of Maxwell's equations with a boundary condition defined by the display.

7. The method of claim 4, wherein the predetermined expression comprises at least one member selected from the group consisting of functions comprising a sine function, a cosine function, and an exponential function, and
   wherein determining the EM field contribution comprises identifying a value of the at least one of the functions in a table stored in a memory.

8. The method of claim 1, comprising:
   determining first respective EM field contributions of the plurality of primitives to a first display element of the plurality of display elements and summing the first respective EM field contributions for the first display element; and
   determining second respective EM field contributions of the plurality of primitives to a second display element of the plurality of display elements and summing the second respective EM field contributions for the second display element.

9. The method of claim 1, comprising:
   determining first respective EM field contributions from a first primitive of the plurality of primitives to each display element of the plurality of display elements;
   determining second respective EM field contributions from a second primitive of the plurality of primitives to each display element of the plurality of display elements; and
   accumulating the EM field contributions for each display element of the plurality of display elements by adding the first and second respective EM field contributions corresponding to the display element.

10. The method of claim 1, further comprising:
    transmitting a timing control signal to an illuminating device to emit light on the display; and
    transmitting the respective control signals to the plurality of display elements to modulate the plurality of display elements so as to cause the light to form a volumetric light field corresponding to the object in an 3D space.

11. The method of claim 1, comprising performing a mathematical function using fixed point number representations by at least one member selected from the group consisting of:
    receiving an expression in a first fixed point format and outputting a value at a second fixed point format that has a level of accuracy different from that of the first fixed point format;

looking up a table for calculation of the mathematical function, wherein the table comprises at least one member selected from the group consisting of a fully enumerated look-up table, an interpolated table, a semi-table based polynomial functions, and a semi-table based on full minimax polynomials;
applying a specialized range reduction for an input; and
transforming a trigonometric calculation from a range $[-\pi, \pi]$ into a signed 2's compliment representation in a range $[-1,1]$.

12. The method of claim 1, comprising calculating respective EM field contributions of each primitive of the plurality of primitives to each display element of the plurality of display elements,
wherein the calculation of the respective EM field contributions is without at least one member selected from the group consisting of: expanding a geometry of the object into the plurality of display elements; applying visibility tests before packing wavefronts; and decision making or communication between parallel calculations for different primitives of the plurality of primitives; and
wherein the calculation of the respective EM field contributions is configured to cause at least one member selected from the group consisting of: tuning parallel calculations for multiple primitives to speed, cost, size or energy optimization; reducing latency between initiating a draw and a result being ready for display; increasing an accuracy using fixed point number representations; and optimizing computation speed by optimizing mathematical functions.

13. The method of claim 1, further comprising representing values using fixed point number representations during calculation,
wherein representing the values using the fixed point number representations is without at least one member selected from the group consisting of: denormal floats for gradual underflow; handling NaN results from operations including division by zero; altering floating point rounding modes; and raising floating point exceptions to an operating system.

14. The method of claim 1, further comprising:
obtaining respective primitive data of the plurality of primitives corresponding to the object;
scaling a first primitive adjacent to a second primitive by a predetermined factor using the respective primitive data for the first primitive and the second primitive; and
updating the respective primitive data for the first primitive based on a result of the scaling.

15. The method of claim 14, wherein the scaling is performed such that a gap between a reconstruction of the first and second primitives in an 3D space is big enough to separate the first and second primitives to minimize an overlapping effect and small enough to make the reconstruction appear seamless.

16. The method of claim 1, comprising:
obtaining a plurality of discrete cosine transform (DCT) weights of an image to be mapped on a specified surface of one or more primitives of the plurality of primitives; and
determining a respective EM field contribution of each of the one or more primitives to each display element of the plurality of display elements by taking into consideration of an effect of the plurality of DCT weights of the image.

17. The method of claim 16, further comprising:
decoding the DCT weights of the image to obtain a respective DCT amplitude for each pixel of the image; and
storing values associated with the respective DCT amplitudes of the pixels of the image together with primitive data of the one or more primitives,
wherein determining the respective EM field contribution comprises calculating the respective EM field contribution from each of the one or more primitives to each of the plurality of display elements with the values associated with the respective DCT amplitudes of the pixels of the image.

18. The method of claim 1, comprising:
obtaining information of a given primitive and an occluder of the given primitive, wherein the given primitive is within the plurality of primitives corresponding to the object;
determining one or more particular display elements that make no contribution to a reconstruction of the given primitive at an effect of the occluder; and
for each of the one or more particular display elements, generating a respective sum of EM field contributions of the plurality of primitives to the particular display element by excluding an EM field contribution of the given primitive to the particular display element.

19. The method of claim 18, wherein determining the one or more particular display elements comprises:
connecting the given primitive to endpoints of the occluder;
extending the connection to the display to determine intersections between the connection and the display; and
determining display elements in a particular range of the display defined by the intersections to be the one or more particular display elements that make no contribution to the reconstruction of the given primitive at the effect of the occluder.

20. The method of claim 1, comprising:
obtaining information of a given primitive and an occluder of the given primitive, wherein the given primitive is within the plurality of primitives corresponding to the object;
for each display element of the plurality of display elements, determining a respective part of the given primitive that make no EM field contribution to the display element at an effect of the occluder; and
for each display element of the plurality of display elements, generating a sum of EM field contributions from the plurality of primitives to the display element by excluding an EM field contribution from the respective part of the given primitive to the display element.

21. The method of claim 20, wherein generating the sum of EM field contributions from the plurality of primitives to the display element comprises one member selected from the group consisting of:
subtracting EM contribution of the respective part of the given primitive to the display element from a sum of the EM field contributions of the plurality of primitives to the display element without the effect of the occluder; and
summing EM field contributions from one or more other parts of the given primitive to the display element, the respective part and the one or more other parts forming the given primitive.

22. The method of claim 20, wherein determining a respective part of the given primitive that make no EM field contribution to the display element at an effect of the occluder comprises:
- connecting the display element to endpoints of the occluder;
- determining intersections between the connection and the given primitive; and
- determining a particular part of the given primitive that is enclosed by the intersections to be the respective part of the given primitive.

23. The method of claim 1, comprising:
- obtaining respective primitive data of each primitive of the plurality of primitives corresponding to the object;
- obtaining respective geometric specular information for each primitive of the plurality of primitives;
- storing the respective geometric specular information with respective primitive data for each primitive of the plurality of primitives; and
- determining a respective EM field contribution of each primitive of the plurality of primitives to each display element of the plurality of display elements by taking into consideration of the respective geometric specular information for the primitive.

24. The method of claim 1, further comprising:
- for each display element of the display, altering the respective control signal with a predetermined calibration value;
- applying the respective altered respective control signal to each display element of the display;
- measuring an output of light incident on the display; and
- evaluating the predetermined calibration value based on the measurement of the output of the light.

25. The method of claim 1, further comprising:
- for each display element of the display,
  - obtaining a respective sum of EM field contributions from the plurality of primitives corresponding to the object;
  - applying a respective mathematical transform to the respective sum of EM field contributions for the display element to obtain a respective transformed sum of EM field contributions for the display element;
  - determining the respective control signal based on the respective transformed sum of EM filed contributions for the display element; and
  - modulating a property of the display element based on the determined respective control signal for the display element;
- introducing light incident on the display;
- measuring an output of the light; and
- adjusting one or more coefficients of the respective mathematical transforms of the plurality of display elements based on a result of the measurement of the output of the light.

26. An apparatus comprising:
- at least one processor; and
- one or more memories coupled to the at least one processor and storing programming instructions for execution by the at least one processor to
  - obtain respective primitive data of each primitive of a plurality of primitives corresponding to an object;
  - obtain respective geometric specular information for each primitive of the plurality of primitives;
  - store the respective geometric specular information with respective primitive data for each primitive of the plurality of primitives;
  - for each primitive of a plurality of primitives corresponding to the object, determine an electromagnetic (EM) field contribution of the primitive to each display element of a plurality of display elements of a display by computing, in a three-dimensional (3D) coordinate system, EM field propagation from the primitive to the display element and taking into consideration of the respective geometric specular information for the primitive; and
  - for each display element of the plurality of display elements, generate a sum of the EM field contributions from the plurality of primitives to the display element.

27. The apparatus of claim 26, wherein the respective geometric specular information for each of the plurality of primitives comprises:
- a reflectivity of a surface of the primitive upon a viewing angle.

28. A system comprising:
- a display comprising a plurality of display elements; and
- a controller coupled to the display and configured to:
  - for each primitive of a plurality of primitives corresponding to an object, determine an electromagnetic (EM) field contribution to each display element of a plurality of display elements of a display by computing, in a three-dimensional (3D) coordinate system, EM field propagation from the primitive to the display element; and
  - for each display element of the plurality of display elements,
    - generate a sum of the EM field contributions from the plurality of primitives to the display element,
    - multiply a scale factor to the sum of the EM field contributions for the display element to obtain a scaled sum of the EM field contributions, and
    - generate a respective control signal based on the scaled sum of the EM field contributions of the plurality of primitives to the display element,
    - wherein the respective control signal is configured to modulate at least one property of the display element based on the scaled sum of the EM field contributions from the plurality of primitives to the display element.

29. The system of claim 28, wherein the controller comprises a plurality of computing units,
- wherein each of the computing units being configured to perform respective operations on one or more primitives of the plurality of primitives corresponding to the object,
- wherein the computing units are configured to operate in parallel, and
- wherein each of the computing units is coupled to one or more respective display elements of the display and configured to transmit the respective control signal to each of the one or more respective display elements.

30. The system of claim 29, wherein each of the computing units is configured to:
- receive, from other computing units of the plurality of computing units, computed EM field contributions from other primitives of the plurality of primitives to each of the one or more respective display elements;
- generate, for each of the one or more respective display elements, the respective sum of the EM field contributions by adding the received computed EM field contributions from the other primitives to the display element.

31. The system of claim 28, further comprising an illuminating device configured to receive a timing control signal from the controller and illuminate light on the display based on the timing control signal.

32. The system of claim 31, wherein the illuminating device is configured to emit the light with different colors,
wherein the controller is configured to sequentially modulate the display with information associated with a first color during a first time period and modulate the display with information associated with a second color during a second, sequential time period, and
wherein the controller is configured to control the illuminating device to sequentially emit the light with the first color during the first time period and emit the light with the second color during the second time period.

33. The system of claim 31, wherein the illuminating device comprises:
a light source configured to emit the light; and
a light guiding device coupled to the light source and arranged adjacent to the display, the light guiding device being configured to receive the emitted light from the light source and guide the emitted light to the display.

34. The system of claim 33, wherein the light guide device is positioned adjacent to a front surface of the display, and
wherein the light is guided to be incident on the front surface of the display.

35. The system of claim 33, wherein the light guiding device is positioned adjacent to a rear surface of the display, and
wherein the light is guided to be incident on the rear surface of the display to transmit through the display and out from a front surface of the display.

36. The system of claim 33, wherein the controller, the display, and the light guiding device form an integrated unit.

37. The system of claim 28, wherein the controller comprises at least one member selected from the group consisting of an application-specific integrated circuit (ASIC), a field-programmable gate array (FPGA), a programmable gate array (PGA), a central processing unit (CPU), a graphics processing unit (GPU), and computing cells.

38. The system of claim 28, wherein the display is configured to be phase modulated, amplitude modulated, or phase and amplitude modulated.

39. The system of claim 28, further comprising:
a computing device configured to generate data comprising respective primitive data of the plurality of primitives corresponding to the object,
wherein the controller is configured to process the data for reconstructing the object in an 3D space with the display.

40. The system of claim 39, wherein the computing device comprises an application programming interface (API) configured to create the respective primitive data by rendering a computer generated (CG) model of the object.

41. A method comprising:
obtaining respective primitive data of a plurality of primitives corresponding to an object;
scaling a first primitive adjacent to a second primitive by a predetermined factor using the respective primitive data for the first primitive and the second primitive;
updating the respective primitive data for the first primitive based on a result of the scaling;
for each primitive of the plurality of primitives corresponding to the object, determining an electromagnetic (EM) field contribution to each display element of a plurality of display elements of a display by computing, in a three-dimensional (3D) coordinate system, EM field propagation from the primitive to the display element; and
for each display element of the plurality of display elements, generating a sum of the EM field contributions from the plurality of primitives to the display element.

42. The method of claim 41, wherein the scaling is performed such that a gap between a reconstruction of the first and second primitives in an 3D space is big enough to separate the first and second primitives to minimize an overlapping effect and small enough to make the reconstruction appear seamless.

43. A method comprising:
for each primitive of a plurality of primitives corresponding to an object, determining an electromagnetic (EM) field contribution to each display element of a plurality of display elements of a display by computing, in a three-dimensional (3D) coordinate system, EM field propagation from the primitive to the display element;
for each display element of the plurality of display elements, generating a sum of the EM field contributions from the plurality of primitives to the display element;
obtaining information of a given primitive and an occluder of the given primitive, wherein the given primitive is within the plurality of primitives corresponding to the object;
determining one or more particular display elements that make no contribution to a reconstruction of the given primitive at an effect of the occluder; and
for each of the one or more particular display elements, generating a respective sum of EM field contributions of the plurality of primitives to the particular display element by excluding an EM field contribution of the given primitive to the particular display element.

44. The method of claim 43, wherein determining the one or more particular display elements comprises:
connecting the given primitive to endpoints of the occluder;
extending the connection to the display to determine intersections between the connection and the display; and
determining display elements in a particular range of the display defined by the intersections to be the one or more particular display elements that make no contribution to the reconstruction of the given primitive at the effect of the occluder.

* * * * *